United States Patent
Kohli

(10) Patent No.: US 10,949,303 B2
(45) Date of Patent: Mar. 16, 2021

(54) DURABLE BLOCK STORAGE IN DATA CENTER ACCESS NODES WITH INLINE ERASURE CODING

(71) Applicant: Fungible, Inc., Santa Clara, CA (US)

(72) Inventor: Jaspal Kohli, Sunnyvale, CA (US)

(73) Assignee: Fungible, Inc., Santa Clara, CA (US)

( * ) Notice: Subject to any disclaimer, the term of this patent is extended or adjusted under 35 U.S.C. 154(b) by 72 days.

(21) Appl. No.: 16/215,178

(22) Filed: Dec. 10, 2018

(65) Prior Publication Data

US 2019/0188079 A1    Jun. 20, 2019

Related U.S. Application Data

(60) Provisional application No. 62/597,185, filed on Dec. 11, 2017.

(51) Int. Cl.
    *G06F 11/10* (2006.01)
    *G06F 3/06* (2006.01)
    (Continued)

(52) U.S. Cl.
    CPC ........ *G06F 11/1076* (2013.01); *G06F 3/0604* (2013.01); *G06F 3/064* (2013.01);
    (Continued)

(58) Field of Classification Search
    CPC .............................. G06F 11/108; G06F 3/0604
    See application file for complete search history.

(56) References Cited

U.S. PATENT DOCUMENTS

| | | | |
|---|---|---|---|
| 8,156,306 B1 | 4/2012 | Raizen et al. | |
| 8,806,296 B1 * | 8/2014 | Lazier ................. | H03M 13/293 |
| | | | 714/763 |

(Continued)

FOREIGN PATENT DOCUMENTS

EP    2750018 A2    7/2014

OTHER PUBLICATIONS

H. Chen and S. Fu, "Improving Coding Performance and Energy Efficiency of Erasure Coding Process for Storage Systems—A Parallel and Scalable Approach," 2016 IEEE 9th International Conference on Cloud Computing (CLOUD), San Francisco, CA, 2016, pp. 933-936.*

(Continued)

*Primary Examiner* — Steve N Nguyen
(74) *Attorney, Agent, or Firm* — Shumaker & Sieffert, P.A

(57) ABSTRACT

Techniques are described in which network devices, such as one or more data center access nodes, are configured to support durable block storage with inline erasure coding, i.e., erasure coding in real time as data is updated. A Durable Block Device (DBD) supports a block level API for one or more storage volumes that may be mapped to one or more applications executed by servers in communication with the data center access nodes. The disclosure describes the operation of the data plane of the DBD that is hosted on one or more access nodes, and its interactions with the management and control planes of the DBD that are hosted on one or more of the servers. The disclosure describes generation of a log structured volume in the DBD configured to gather multiple data blocks into larger chunks of data for inline erasure coding for storage across multiple storage devices.

22 Claims, 7 Drawing Sheets

(51) Int. Cl.
  *G06F 12/10* (2016.01)
  *H03M 13/15* (2006.01)
(52) U.S. Cl.
  CPC ............ *G06F 3/067* (2013.01); *G06F 3/0619* (2013.01); *G06F 3/0631* (2013.01); *G06F 3/0659* (2013.01); *G06F 3/0683* (2013.01); *G06F 12/10* (2013.01); *H03M 13/154* (2013.01); *G06F 3/0665* (2013.01); *G06F 2212/657* (2013.01)

(56) References Cited

U.S. PATENT DOCUMENTS

| | | | |
|---|---|---|---|
| 9,065,482 | B1 | 6/2015 | Johnston et al. |
| 9,547,553 | B1* | 1/2017 | Khermosh .............. G06F 11/10 |
| 10,091,295 | B1* | 10/2018 | Savic .................. H04L 67/1097 |
| 2003/0084020 | A1 | 5/2003 | Shu |
| 2010/0246663 | A1 | 9/2010 | Citta et al. |
| 2010/0332401 | A1 | 12/2010 | Prahlad et al. |
| 2013/0031446 | A1 | 1/2013 | Kamiya |
| 2014/0324793 | A1 | 10/2014 | Glazemakers |
| 2014/0380126 | A1 | 12/2014 | Yekhanin et al. |
| 2015/0244804 | A1* | 8/2015 | Warfield ............... H04L 47/621 709/219 |
| 2016/0077746 | A1 | 3/2016 | Muth et al. |
| 2016/0182088 | A1* | 6/2016 | Sipos .................. H04L 67/1097 714/764 |
| 2016/0239384 | A1 | 8/2016 | Slik et al. |
| 2016/0314043 | A1 | 10/2016 | Slik |
| 2016/0378401 | A1* | 12/2016 | Savic ..................... G06F 3/067 710/74 |
| 2017/0090765 | A1 | 3/2017 | Balinski et al. |
| 2017/0187398 | A1 | 6/2017 | Trusov et al. |
| 2017/0250712 | A1 | 8/2017 | Chiu et al. |
| 2017/0277713 | A1* | 9/2017 | Strauss ................. G06F 16/183 |
| 2018/0004600 | A1 | 1/2018 | Danilov et al. |
| 2018/0018235 | A1* | 1/2018 | Arslan ................ H03M 13/356 |
| 2018/0287965 | A1 | 10/2018 | Sindhu et al. |
| 2018/0293168 | A1 | 10/2018 | Noureddine et al. |
| 2018/0331784 | A1 | 11/2018 | Chiu et al. |
| 2019/0012278 | A1 | 1/2019 | Sindhu et al. |
| 2019/0013965 | A1 | 1/2019 | Sindhu et al. |
| 2019/0026034 | A1* | 1/2019 | Tashiro ............... G06F 11/1076 |
| 2019/0104206 | A1 | 4/2019 | Goel et al. |
| 2019/0104207 | A1 | 4/2019 | Goel et al. |
| 2019/0158428 | A1 | 5/2019 | Gray et al. |
| 2019/0188079 | A1 | 6/2019 | Kohli |
| 2019/0243765 | A1 | 8/2019 | Noureddine et al. |
| 2019/0370170 | A1 | 12/2019 | Oltean et al. |

OTHER PUBLICATIONS

G. Xu, S. Lin, H. Zhang, X. Guo and K. Shi, "Expander code: A scalable erasure-resilient code to keep up with data growth in distributed storage," 2013 IEEE 32nd International Performance Computing and Communications Conference (IPCCC), San Diego, CA, 2013, pp. 1-9.*

Response to Written Opinion dated Feb. 28, 2019, from International Application No. PCT/US2018/064764, filed Oct. 11, 2019, 21 pp.

Second Written Opinion of International Application No. PCT/US2018/064764, dated Nov. 7, 2019, 8 pp.

Huang et al., "Erasure Coding in Windows Azure Storage," Microsoft Corporation, USENIX ATC'12 Proceedings of the 2012 USENIX conference on Annual Technical Conference, Jun. 13-15, 2012, 12 pp.

Huang et al., "Pyramid Codes: Flexible Schemes to Trade Space for Access Efficiency in Reliable Data Storage Systems," Microsoft Corporation, 2007 (Applicant points out, in accordance with MPEP 609.04(a), that the year of publication, 2007, is sufficiently earlier than the effective U.S. filing date, so that the particular month of publication is not in issue.) 14 pp.

Schroeder et al., "Flash Reliability in Production: The Expected and the Unexpected," 14th USENIX Conference on File and Storage Technologies (FAST '16), Feb. 22-25, 2016, pp. 67-80.

U.S. Appl. No. 16/265,606, filed Feb. 1, 2019, by Goyal et al.

U.S. Appl. No. 16/169,736, filed Oct. 24, 2018, by Goyal et al.

International Search Report and Written Opinion of International Application No. PCT/US2018/064764, dated Feb. 28, 2019, 14 pp.

Response to Second Written Opinion dated Nov. 7, 2019, from international application No. PCT/US2018/064764, filed Jan. 7, 2020, 25 pp.

International Preliminary Report on Patentability from International Application No. PCT/US2018/064764, dated Feb. 13, 2020, 28 pp.

* cited by examiner

DURABLE BLOCK STORAGE IN DATA CENTER ACCESS NODES WITH INLINE ERASURE CODING

This application claims the benefit of U.S. Provisional Appl. No. 62/597,185, filed Dec. 11, 2017, the entire content is incorporated herein by reference.

TECHNICAL FIELD

The invention relates to persistent storage and, more particularly, persistent storage for volumes mapped to applications within data center networks.

BACKGROUND

In a typical cloud-based data center, a large collection of interconnected servers provides computing and/or storage capacity for execution of various applications. For example, a data center may comprise a facility that hosts applications and services for subscribers, i.e., customers of the data center. The data center may, for example, host all of the infrastructure equipment, such as compute nodes, networking and storage systems, power systems, and environmental control systems. In most data centers, clusters of storage systems and application servers are interconnected via a high-speed switch fabric provided by one or more tiers of physical network switches and routers. Data centers vary greatly in size, with some public data centers containing hundreds of thousands of servers, and are usually distributed across multiple geographies for redundancy.

As part of a hosted storage system, a data center or other computer network typically includes a plurality of solid state storage devices and/or rotating hard disk storage devices for storing and retrieving blocks of data for applications executing on the servers of the data center. A block of data is a sequence of bytes or bits having a fixed length (i.e., a block size). The servers of the data center may launch the applications as virtual machines or containers, or natively, and often virtualize the attached storage devices to allow sharing. The virtualized storage devices may be raw block devices that provide a level of abstraction for the hardware storage devices responsible for storing and retrieving blocks of data. A raw block device typically provides storage of a single copy of the data blocks maintained by the underlying storage device with no redundancy, but some inline treatment (e.g., encryption). Each raw storage block device, e.g., volume, may be treated as an independent disk drive and mapped to a virtual machine or container of one of the servers of the data center. In some examples, the servers may support durable block devices as a further level of abstraction that provide redundant storage of the data blocks that can tolerate one or more failures (e.g., storage media, network, etc.). However, durable block devices may benefit from data reduction techniques, such as compression, erasure coding, and/or deduplication, which are computationally intensive for the processors of the servers of the data center and difficult to scale.

SUMMARY

Techniques are described in which network devices, such as one or more data center access nodes, are configured to support durable block storage with inline erasure coding, i.e., erasure coding in real time as data is updated. For example, this disclosure describes various implementations of a Durable Block Device (DBD) feature integrated within a storage stack of the data center access nodes. The DBD supports a block level application programming interface (API) for one or more storage volumes that may be mapped to one or more applications (e.g., native, virtual machine, container, network, or other application) executed by servers in communication with the data center access nodes. The disclosure describes the operation of the data plane of the DBD that is hosted on one or more access nodes, and its interactions with the management and control planes of the DBD that are hosted on one or more of the servers. More specifically, the disclosure describes generation of a log structured volume in the DBD that enables the data plane of the DBD hosted on the one or more access nodes to gather multiple data blocks into larger chunks of data for inline erasure coding for storage across multiple storage devices. The state machine for how chunks are selected, updated, flushed, and compacted is also described.

In some examples, the DBD provides a configurable size (in number of blocks) and is made durable using a configurable policy (replication and/or erasure coding). The target access nodes where the replicas and/or erasure coded pieces are stored can be managed by the management plane of the DBD (e.g. Openstack Cinder plugins). Multiple access nodes that form a cluster may provide a common storage pool, e.g., a plurality of solid state drive (SSD) storage devices and/or hard disk drive (HDD) storage devices. An example use case for the DBD is applications and services that store persistent data using a block API, such as databases (both structured query language (SQL) and non-SQL (NOSQL)), filesystems, virtual desktop, and the like.

The details of one or more examples are set forth in the accompanying drawings and the description below. Other features, objects, and advantages of the invention will be apparent from the description and drawings, and from the claims.

DETAILED DESCRIPTION

Figure 1:
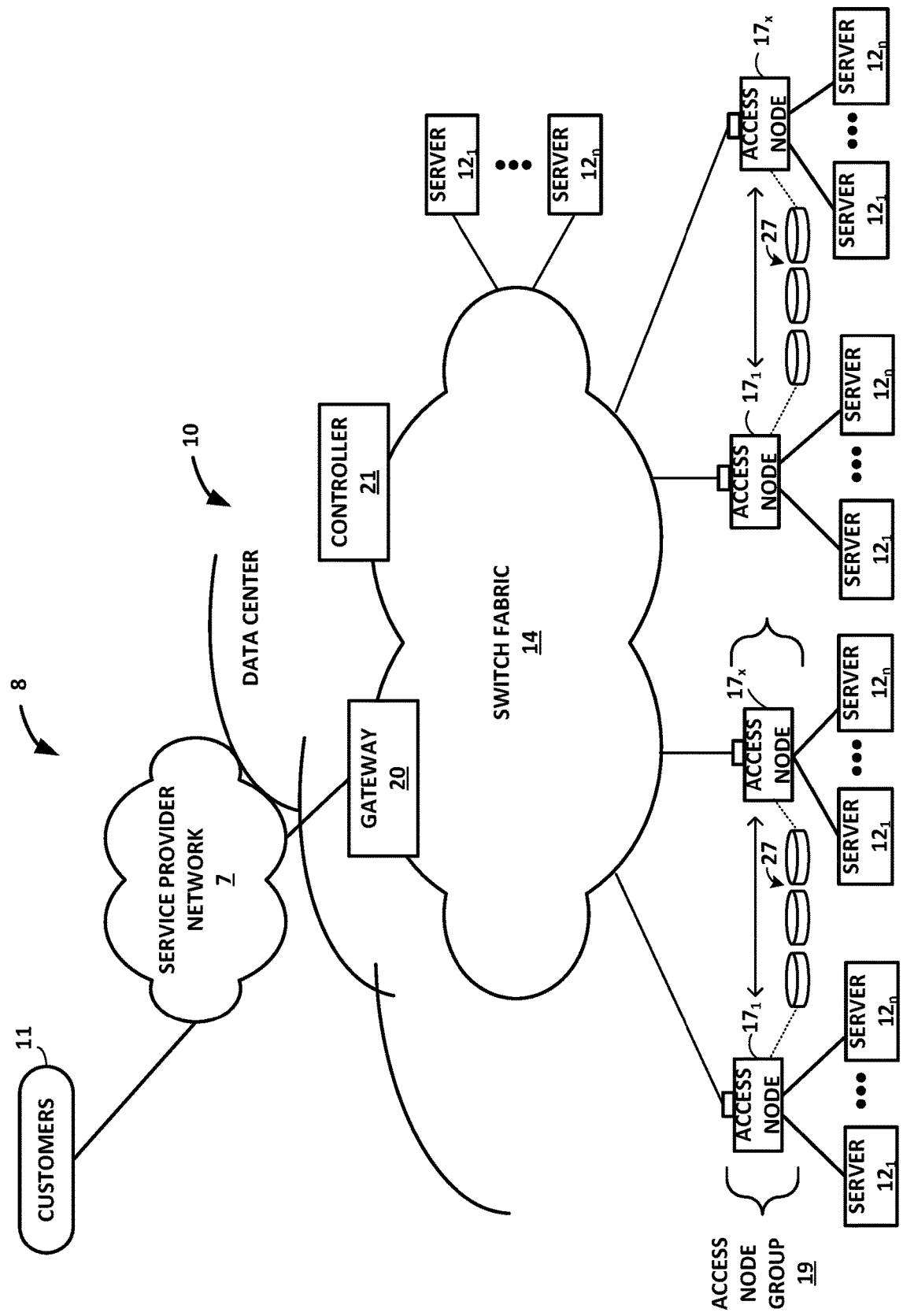
FIG. 1 is a block diagram illustrating an example network having a data center in which examples of the techniques described herein may be implemented.

FIG. 1 is a block diagram illustrating an example network 8 having a data center 10 in which examples of the techniques described herein may be implemented. In general, data center 10 provides an operating environment for applications and services for customers 11 coupled to the data center by service provider network 7 and gateway device 20. In other examples, content/service provider network 7 may be a data center wide-area network (DC WAN), private network or other type of network. Data center 10 may, for example, host infrastructure equipment, such as compute nodes, networking and storage systems, redundant power supplies, and environmental controls. Service provider network 7 may be coupled to one or more networks administered by other providers, and may thus form part of a large-scale public network infrastructure, e.g., the Internet.

In some examples, data center 10 may represent one of many geographically distributed network data centers. In the example of FIG. 1, data center 10 is a facility that provides information services for customers 11. Customers 11 may be collective entities such as enterprises and governments or individuals. For example, a network data center may host web services for several enterprises and end users. Other exemplary services may include data storage, virtual private networks, file storage services, data mining services, scientific- or super-computing services, and so on.

In the illustrated example, data center 10 includes a set of storage systems and application servers 12 interconnected via a high-speed switch fabric 14. In some examples, servers 12 are arranged into multiple different server groups, each including any number of servers up to, for example, n servers $12_1$-$12_n$. Servers 12 provide computation and storage facilities for applications and data associated with customers 11 and may be physical (bare-metal) servers, virtual machines running on physical servers, virtualized containers running on physical servers, or combinations thereof.

In the example of FIG. 1, software-defined networking (SDN) controller 21 provides a high-level controller for configuring and managing the routing and switching infrastructure of data center 10. SDN controller 21 provides a logically and in some cases physically centralized controller for facilitating operation of one or more virtual networks within data center 10 in accordance with one or more embodiments of this disclosure. In some examples, SDN controller 21 may operate in response to configuration input received from a network administrator. In some examples, SDN controller 21 operates to configure access nodes 17 to logically establish one or more virtual fabrics as overlay networks dynamically configured on top of the physical underlay network provided by switch fabric 14, in accordance with the techniques described herein. For example, SDN controller 21 may learn and maintain knowledge of access nodes 21 and establish a communication control channel with each of the access nodes. SDN controller 21 uses its knowledge of access nodes 17 to define multiple sets (groups) of two of more access nodes 17 to establish different virtual fabrics over switch fabric 14. More specifically, SDN controller 21 may use the communication control channels to notify each of access nodes 17 for a given set which other access nodes are included in the same set. In response, access nodes 17 dynamically setup FCP tunnels with the other access nodes included in the same set as a virtual fabric over packet switched network 410. In this way, SDN controller 21 defines the sets of access nodes 17 for each of the virtual fabrics, and the access nodes are responsible for establishing the virtual fabrics. As such, underlay components of switch fabric 14 may be unware of virtual fabrics. In these examples, access nodes 17 interface with and utilize switch fabric 14 so as to provide full mesh (any-to-any) interconnectivity between access nodes of any given virtual fabric. In this way, the servers connected to any of the access nodes forming a given one of virtual fabrics may communicate packet data for a given packet flow to any other of the servers coupled to the access nodes for that virtual fabric using any of a number of parallel data paths within switch fabric 14 that interconnect the access nodes of that virtual fabric. More details of access nodes operating to spray packets within and across virtual overlay networks are available in U.S. Provisional Patent Application No. 62/638,788, filed Mar. 5, 2018, entitled "NETWORK ACCESS NODE VIRTUAL FABRICS CONFIGURED DYNAMICALLY OVER AN UNDERLAY NETWORK," the entire content of which is incorporated herein by reference.

Although not shown, data center 10 may also include, for example, one or more core switches, routers, hubs, gateways, security devices such as firewalls, intrusion detection, and/or intrusion prevention devices, servers, computer terminals, laptops, printers, databases, wireless mobile devices such as cellular phones or personal digital assistants, wireless access points, bridges, cable modems, application accelerators, or other network devices.

In the example of FIG. 1, at least one group of servers 12 is coupled directly to switch fabric 14, and at least one other group of servers 12 is coupled to switch fabric 14 by an access node 17 for processing streams of information, such as network packets or storage packets. As further described herein, in one example, each access node 17 is a highly programmable I/O processor specially designed for offloading certain functions from servers 12. In one example, each access node 17 includes two or more processing cores consisting of a number of internal processor clusters equipped with hardware engines that offload cryptographic functions, compression and regular expression (RegEx) processing, data storage functions and networking operations. In this way, each access node 17 includes components for fully implementing and processing network and storage stacks on behalf of one or more servers 12. In addition, access nodes 17 may be programmatically configured to serve as a security gateway for its respective servers 12, freeing up the processors of the servers to dedicate resources to application workloads. In some example implementations, each access node 17 may be viewed as a network interface subsystem that implements full offload of the handling of data packets (with zero copy in server memory) and storage acceleration for the attached server systems. In one example, each access node 17 may be implemented as one or more application-specific integrated circuit (ASIC) or other hardware and software components, each supporting a subset of the servers. Access nodes 17 may also be referred to as data processing units (DPUs), or devices including DPUs. In other words, the term access node may be used herein interchangeably with the term DPU. Additional example details of various example access nodes are described in U.S. Provisional Patent Application No. 62/559,021, filed Sep. 15, 2017, entitled "Access Node for Data Centers," and U.S. Provisional Patent Application No. 62/530,691, filed Jul. 10, 2017, entitled "Data Processing Unit for Computing Devices," the entire contents of both being incorporated herein by reference In the example of FIG. 1, each access node 17 provides connectivity to switch fabric 14 for a different group of servers 12 and may be assigned respective IP addresses and provide routing operations for the servers 12 coupled thereto. Access nodes 17 may interface with and utilize core switches within switch fabric 14 so as to provide full-mesh (any-to-any) interconnectivity such that any of servers 12 coupled to access nodes 17 may communicate packet data for a given packet flow to any other of the servers using any of a number of parallel data paths within the data center 10. In addition, access nodes 17 described herein may provide additional services, such as storage (e.g., integration of solid-state storage devices), security (e.g., encryption), acceleration (e.g., compression and encryption), I/O offloading, and the like. An example architecture of access nodes 17 is described below with respect to FIG. 3. With respect to the example, the architecture of each access node 17 comprises a multiple core processor system that represents a high performance, hyper-converged network, storage, and data processor and input/output hub.

In example implementations, access nodes 17 are configurable to operate in a standalone network appliance having one or more access nodes. For example, access nodes 17 may be arranged into multiple different access node groups 19, each including any number of access nodes up to, for example, x access nodes $17_1$-$17_x$. As such, multiple access nodes 17 may be grouped (e.g., within a single electronic device or network appliance), referred to herein as an access node group 19, for providing services to a group of servers 12 supported by the set of access nodes 17 internal to the device. In other examples, each access node may be implemented as a component (e.g., electronic chip) within a device, such as a compute node, application server, storage server, and may be deployed on a motherboard of the device or within a removable card, such as a storage and/or network interface card.

In general, one or more access nodes 17, as a data processing unit, may operate to provide seamless access to storage devices 17, which may be physically coupled to the access node, remotely accessible over switch fabric 14, accessible through one or more storage servers 12, or combinations thereof. As an example, each access node group 19 may be configured to operate as a high-performance I/O hub designed to aggregate and process network and/or storage I/O for multiple servers 12. As described above, the set of access nodes 17 within each of the access node groups 19 provide highly-programmable, specialized I/O processing circuits for handling networking and communications operations on behalf of servers 12. In addition, in some examples, each of access node groups 19 may logically include storage devices 27, such as solid state drives (SSDs) and/or hard disk drives (HDDs), configured to provide network accessible storage for use by applications executing on the servers 12. In some examples, one or more of the SSDs may comprise non-volatile memory (NVM) or flash memory. Each access node group 19 including its set of access nodes 17 and storage devices 27, and the set of servers 12 supported by the access nodes 17 of that access node group 19 may be referred to herein as a network storage compute unit (NSCU), which is described in more detail below with respect to FIG. 2.

More details on the data center network architecture and interconnected access nodes illustrated in FIG. 1 are available in U.S. patent application Ser. No. 15/939,227, filed Mar. 28, 2018, and U.S. Provisional Patent Application No. 62/514,583, filed Jun. 2, 2017, entitled "Non-Blocking Any-to-Any Data Center Network with Packet Spraying Over Multiple Alternate Data Paths,", the entire content of each being incorporated herein by reference.

In this way, according to the techniques herein, example implementations are described in which access nodes 17 interface and utilize switch fabric 14 so as to provide full mesh (any-to-any) interconnectivity such that any of servers 12 may communicate packet data for a given packet flow to any other of the servers using any of a number of parallel data paths within the data center 10. For example, example network architectures and techniques are described in which access nodes, in example implementations, spray individual packets for packet flows between the access nodes and across some or all of the multiple parallel data paths in the data center switch fabric 14 and reorder the packets for delivery to the destinations so as to provide full mesh connectivity.

As described herein, the techniques of this disclosure may make use of a new data transmission protocol referred to as a Fabric Control Protocol (FCP) that may be used by the different operational networking components of any of access nodes 17 to facilitate communication of data across switch fabric 14. As further described, FCP is an end-to-end admission control protocol in which, in one example, a sender explicitly requests a receiver with the intention to transfer a certain number of bytes of payload data. In response, the receiver issues a grant based on its buffer resources, QoS, and/or a measure of fabric congestion. In general, FCP enables spray of packets of a flow to all paths between a source and a destination node, and may provide any of the advantages and techniques described herein, including resilience against request/grant packet loss, adaptive and low latency fabric implementations, fault recovery, reduced or minimal protocol overhead cost, support for unsolicited packet transfer, support for FCP capable/incapable nodes to coexist, flow-aware fair bandwidth distribution, transmit buffer management through adaptive request window scaling, receive buffer occupancy based grant management, improved end to end QoS, security through encryption and end to end authentication and/or improved ECN marking support. More details on the FCP are available in U.S. patent application Ser. No. 16/147,070, filed Sep. 28, 2018, and U.S. Provisional Patent Application No. 62/566,060, filed Sep. 29, 2017, entitled "Fabric Control Protocol for Data Center Networks with Packet Spraying Over Multiple Alternate Data Paths," the entire content of each being incorporated herein by reference.

Typically, as part of a hosted storage system, servers 12 (e.g., storage servers) of a data center 10 would be responsible for performing data storage functions to store and retrieve blocks of data for applications executing on the servers (e.g., compute nodes also referred to as application servers). A block of data can be viewed as a sequence of bytes or bits having a given block size (i.e., a fixed length). In some examples, the servers executing the applications may launch the applications as or on virtual machines or containers, or natively, and virtualize the attached storage devices to allow sharing. The virtualized storage devices may be raw block devices that provide a level of abstraction for the hardware storage devices responsible for storing and retrieving blocks of data. A raw block device provides storage of a single copy of the data blocks with no replication, but some inline treatment (e.g., encryption) prior to storage. Each raw storage volume may be treated as an independent disk drive and mapped to a virtual machine or container hosted on one of the servers of the data center.

In some examples, the servers may support durable block devices as a further level of abstraction that provide redundant storage of the data blocks that can tolerate one or more failures (e.g., storage media, network, etc.). Currently, many persistent storage solutions provide durability using replication in which the data blocks are replicated a number of times based on a replication factor, e.g., 3, and distributed across the storage devices. Replication ensures high data availability to protect against device or node failures. For example, if the data stored in one storage location becomes corrupted or the storage device or connecting node fails, a duplicate copy of the data may be recovered from one of the other storage locations.

As data centers and their storage device clusters increase in scale, the cost of storage may become a constraint. Therefore, persistent storage in large data centers may benefit from data reduction techniques, such as compression, erasure coding, and/or deduplication. Compression and deduplication are true data reduction techniques that reduce the cost of storage, whereas erasure coding is a data redundancy technique that provides data reduction in comparison to replication.

As an example, erasure coding is a data protection technique in which data is broken into fragments, expanded, and encoded with a configurable amount of redundant data pieces and stored across a set of storage devices. Erasure coding provides reliability by enabling data that becomes corrupted at one storage location to be reconstructed using information about the data that is stored at another storage location. Erasure coding uses a mathematical function, i.e., polynomial interpolation or oversampling, to describe a set of numbers so they can be checked for accuracy and recovered is one is lost. The protection provided by erasure coding may be represented as 'M+N', where the variable 'M' is the original amount of data and the variable 'N' is the extra or redundant data added to provide protection from failures. The amount of extra data (i.e., 'N') is typically less than the amount of the original data (i.e., 'M'). In this way, erasure coding, which may store less than twice the amount of the original data, provides data reduction in comparison to traditional replication, which may store three or more complete copies of the original data.

The data reduction techniques, particularly erasure coding, are computationally intensive for the processors of the servers and difficult to scale for data centers. This is especially true for storage of small data blocks, e.g., 4 KB data blocks compressed to 1 or 0.5 KB, which are inefficient to store in flash memory. Therefore, although some current persistent storage solutions are configured to perform erasure coding, it is performed only in the background and at high cost.

As discussed above, access nodes 17 (also referred to herein as data processing units) are configured to operate as high-performance I/O processors that offload functions from servers 12, including data storage functions. In accordance with the techniques described in this disclosure, one or more of access nodes 17 are configured to establish a Durable Block Device (DBD) in a storage stack, i.e., multiple layers of abstraction from hardware storage devices 27, that may be mapped to one or more applications (e.g., native, virtual machine, container, network, or other application) executed by servers 12. The DBD representing a logical storage device presented by a collection of one or more of access nodes 17, where the logical storage device of the DBD provide a level of abstraction from the physical storage devices and, moreover, presents block-level storage operations on the logical storage. The DBD provides persistent storage of data blocks and, as described herein, enables seamless hardware-based inline erasure coding enabled by the hardware engines of access nodes 17. In some examples, the DBD may further provide a combination of inline erasure coding and compression. The term inline erasure coding is used throughout this disclosure to mean erasure coding in real time as data is updated. Further example details of an access node (data processing unit) having specialized hardware-based accelerators for inline erasure coding are described in U.S. patent application Ser. No. 16/169,736, filed Oct. 24, 2018, entitled "INLINE RELIABILITY CODING FOR STORAGE ON A NETWORK" and U.S. patent application Ser. No. 16/169,736, filed Oct. 24, 2018, entitled "INLINE RELIABILITY CODING FOR STORAGE ON A NETWORK," the entire contents of which are incorporated herein by reference.

The disclosure describes the operation of the data plane of various example implementations of a DBD that is hosted on one or more of access nodes 17, and its interactions with the management and control planes of the DBD that are hosted on one or more of servers 12. More specifically, the disclosure describes generation of a log structured volume in the DBD that enables the data plane of the DBD hosted on one or more of access nodes 17 to gather multiple data blocks into larger chunks of data for inline erasure coding prior to storage across multiple of storage devices 27. An example system architecture of the DBD is described in more detail with respect to FIG. 4, an example object model for the data plane of the DBD is described in more detail with respect to FIG. 5, and an example implementation of the log structured volume in the DBD are described in more detail with respect to FIG. 6.

Example implementations of the DBD described herein support a block level application programming interface (API) for one or more storage volumes that may be mapped to the applications executed by servers 12. The DBD provides a configurable size (in number of blocks) and is made durable using a configurable policy (replication and/or erasure coding). The one or more of access nodes 17 where the replicas and/or erasure coded pieces are stored is managed by a management plane of the DBD (e.g. Openstack Cinder plugins) executed on one of servers 12. Access nodes 17 that form a cluster, e.g., a number of physical racks in data center 10, may provide a common pool of storage devices 27, e.g., a plurality of solid state drive (SSD) storage devices and/or hard disk drive (HDD) storage devices, accessible by any of servers 12, including the at least one group of servers 12 coupled directly to switch fabric 14. An example use case for the DBD is applications and services that store persistent data using a block API, such as databases (both structured query language (SQL) and non-SQL (NOSQL)), filesystems, virtual desktop, and the like.

The DBD feature provided by one or more of access nodes 17 achieves several goals that would be difficult or impossible to achieve with a typical durable block device supported by a standard processor of a server, e.g., an x86 server. The DBD feature is designed as a scale-out model that includes 1000s of storage volumes per access node 17 and tens of thousands of access nodes 17 in a cluster. The DBD feature minimizes latency of I/O operations (primarily read and write of data blocks) done by the applications executing on servers 12. This includes variable workloads including small random I/Os as well large I/Os. One example technical advantage is to reduce the overhead for implementing durability (including compute and networking) from tens of milliseconds, as is common, to around 100 µs within a network, such as data center 10. In this environment, expected network roundtrip times are less than 10 µs for examples described herein. The DBD feature may also provide the technical benefit of reduced performance penalty in degraded mode (i.e., in the presence of one of more tolerable device failures). For example, performance penalty may be reduced to within two times the latency under normal conditions.

The DBD feature optimizes for flash memory I/O performance and durability behavior. In particular, the DBD feature minimizes write amplification by avoiding small random writes (e.g. <16 KB). The DBD feature minimizes the rebuild time on a device/node failure. The rough goal is to keep this in order of minutes. The DBD feature has configurable levels of replication or erasure coding (M+N) to the extent supported in the hardware accelerators of access nodes 17 and practically useful. Current targets are a replication factor of 3 and erasure coding up to 32+8. The DBD feature with inline erasure coding co-exists with other data reduction techniques (e.g., compression, deduplication, and thin provisioning). The DBD feature supports saving point-in-time copies of the DBD in the form of a snapshot. A snapshot creates a temporary read-only device that can be copied to another device or object. The snapshot model is described in more detail below with respect to FIG. 7.

Given the above goals and the architecture and capabilities of access nodes 17, the DBD feature includes the following design considerations. First, the DBD feature includes granular processing in the data plane to avoid memory fragmentation and commitment. User requests are handled at a block size granularity. They are aggregated again before requests are sent down to storage devices 27. Second, each user volume of the DBD should be spread over a large number of storage devices 27 in order to minimize recovery time and avoid hot spots. Recovery should also be spread across access nodes 17 to scale erasure coding performance. Third, the DBD feature includes a log structured data layout to avoid small random writes for flash memory optimization, enable erasure coding on larger units of blocks, and enable compression of blocks that results in variable size blocks being stored. Fourth, the DBD feature uses a flexible controller model (i.e., primary and backup) to ensure consistency across replicas and/or erasure coded pieces in the network.

Although access nodes 17 are described in FIG. 1 with respect to switch fabric 14 of data center 10, in other examples, access nodes may provide full mesh interconnectivity over any packet switched network. For example, the packet switched network may include a local area network (LAN), a wide area network (WAN), or a collection of one or more networks. The packet switched network may have any topology, e.g., flat or multi-tiered, as long as there is full connectivity between the access nodes. The packet switched network may use any technology, including IP over Ethernet as well as other technologies. Irrespective of the type of packet switched network, in accordance with the techniques described in this disclosure, access nodes may spray individual packets for packet flows between the access nodes and across multiple parallel data paths in the packet switched network and reorder the packets for delivery to the destinations so as to provide full mesh connectivity.

Figure 2:
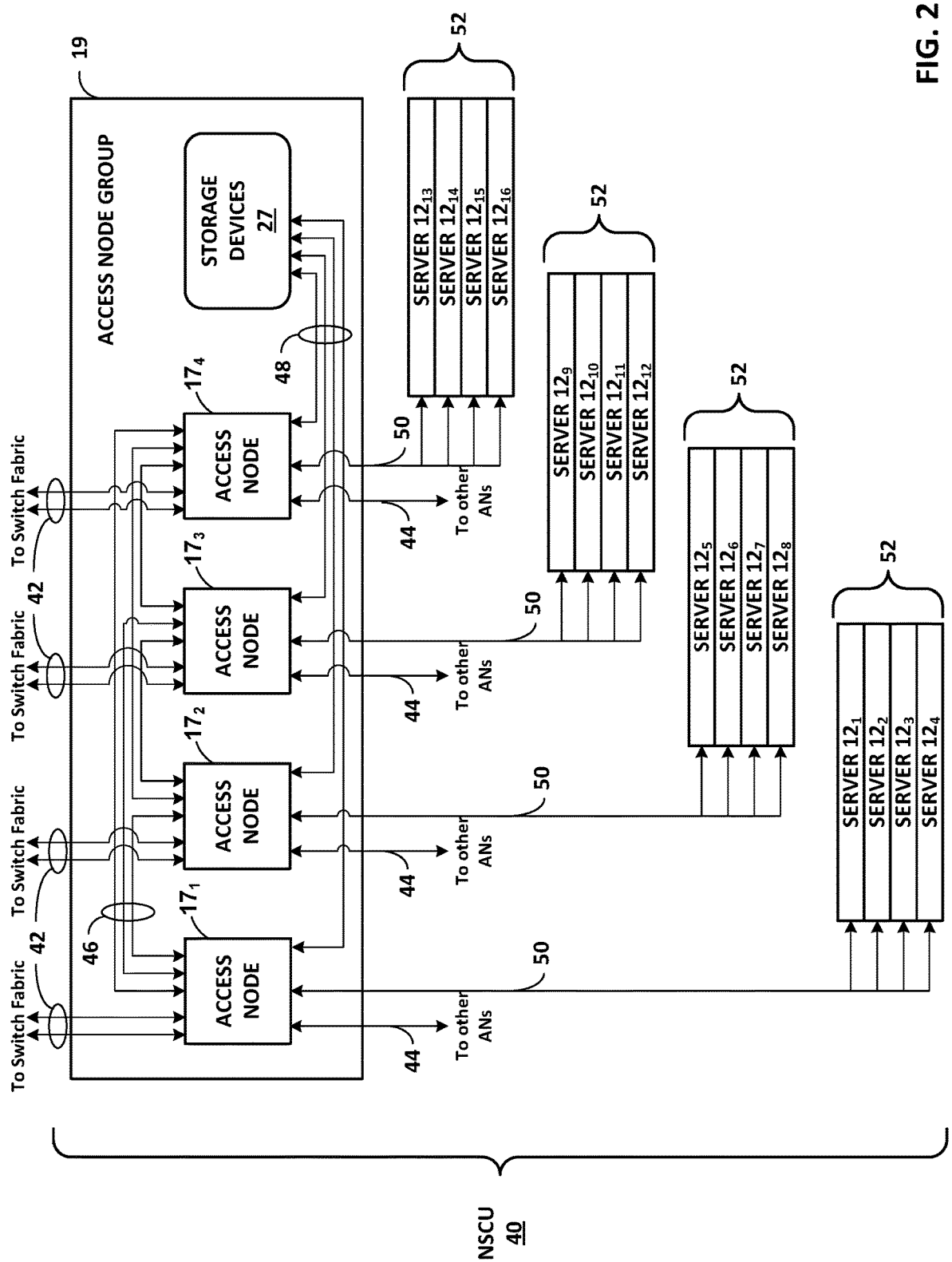
FIG. 2 is a block diagram illustrating one example of network storage compute unit (NSCU) 40 including an access node group and its supported servers.

FIG. 2 is a block diagram illustrating one example of a network storage compute unit (NSCU) 40 including an access node group 19 and its supported servers 12. Access node group 19 may be configured to operate as a high-performance I/O hub designed to aggregate and process network and storage I/O to multiple servers 12. In the example of FIG. 2, access node group 19 includes four access nodes $17_1$-$17_4$ (collectively, "access nodes 17") connected to a local pool of storage devices 27, e.g., SSDs and/or HDDs. In some examples, storage devices 27 may be a local pool of Non-Volatile Memory express (NVMe)-based SSD storage devices or flash memory accessible by each of access nodes 17. The local pool of storage devices 27 of access node group 19 may form one portion of a common pool of storage created by the access nodes included in a cluster, e.g., a number of physical racks within data center 10 of FIG. 1, and accessible by all servers coupled to the switch fabric of the data center.

Although access node group 19 is illustrated in FIG. 2 as including four access nodes 17 that are all connected to local pool of storage devices 27, an access node group may be arranged in other ways. In one example, each of the four access nodes 17 may be included on an individual access node sled that also includes at least one storage device for the access node. In this example, an access node group may include four access node sleds each having an access node and at least one storage device. In a similar manner as described above, the storage devices included on the access node sleds of the access node group may form one portion of a common pool of storage created by the access nodes included in a cluster.

In the illustrated example of FIG. 2, access node group 19 supports a total of sixteen servers $12_1$-$12_{16}$ (collectively, "servers 12") with each of the four access nodes 17 within access node group 19 supporting four of servers 12. In some examples, each of the four servers 12 supported by each of the access nodes 17 may be arranged as a server device 52. In some examples, each of servers 12 described throughout this application may be dual-socket or dual-processor "server nodes" that are arranged in groups of two or more within a standalone server device, e.g., server devices 52.

In one example implementation, access nodes 17 within access node group 19 connect to servers 12 and local pool of storage devices 27 using Peripheral Component Interconnect express (PCIe) links 48, 50, and connect to other access nodes and the data center switch fabric 14 using Ethernet links 42, 44, 46. For example, each of access nodes 17 may support six high-speed Ethernet connections, including two externally-available Ethernet connections 42 for communicating with the switch fabric, one externally-available Ethernet connection 44 for communicating with other access nodes in other access node groups, and three internal Ethernet connections 46 for communicating with other access nodes 17 in the same access node group 19. In some examples, connections 44 may be referred to as "inter-access node group links" and connections 46 may be referred to as "intra-access node group links."

Ethernet connections 44, 46 provide full-mesh connectivity between access nodes within a given structural unit. In one example, such a structural unit may be referred to herein as a logical rack (e.g., a half-rack or a half physical rack) that includes two NSCUs 40 having two access node groups 19 and supports an 8-way mesh of eight access nodes 17 for those access node groups. In this particular example, connections 46 would provide full-mesh connectivity between the four access nodes 17 within the same access node group 19, and connections 44 would provide full-mesh connectivity between each of access nodes 17 and four other access nodes within the other access node group of the logical rack (i.e., structural unit). In addition, access nodes 17 within access node group 19 may connect to other access nodes within other logical racks or other physical racks via Ethernet connections 42 to form a cluster with full-mesh interconnectivity. A cluster includes a number of logical or physical racks that are interconnected via core switches of switch fabric 14 of data center 10 (FIG. 1).

According to the techniques of this disclosure, one or more of access nodes 17 are configured to offload data storage functions from servers 12 by establishing a durable block device (DBD) for storage devices 27. The DBD provides levels of abstraction from storage devices 27 that allow access nodes 17 to perform data storage functions to store and retrieve data blocks for applications executed on servers 12 or for other remote servers located within the network. In addition, the DBD allows sharing of storage devices 27 by all access nodes interconnected with access nodes 17 of access node group 19 in a cluster. As described briefly above, the DBD is designed as a scale-out model that enables local pools of storage devices included in the cluster to act as a common pool of storage that is durable and redundant. The scale-out model is enabled by a data plane of the DBD hosted on the full-mesh interconnected access nodes 17, and management and control planes of the DBD hosted on one or more of servers 12 that logically tie together operation of access nodes 17. For example, each of the access nodes in the cluster may host 1000s of storage volumes virtualized from the common pool of storage, and the cluster may include tens of thousands of access nodes. If one of the access nodes fails along with all of its I/O devices, the data stored in the hosted storage volumes is not lost and does not become unavailable. Instead, any of the other access nodes in the cluster may reestablish the storage volumes and access the data from the common pool of storage.

Figure 3:
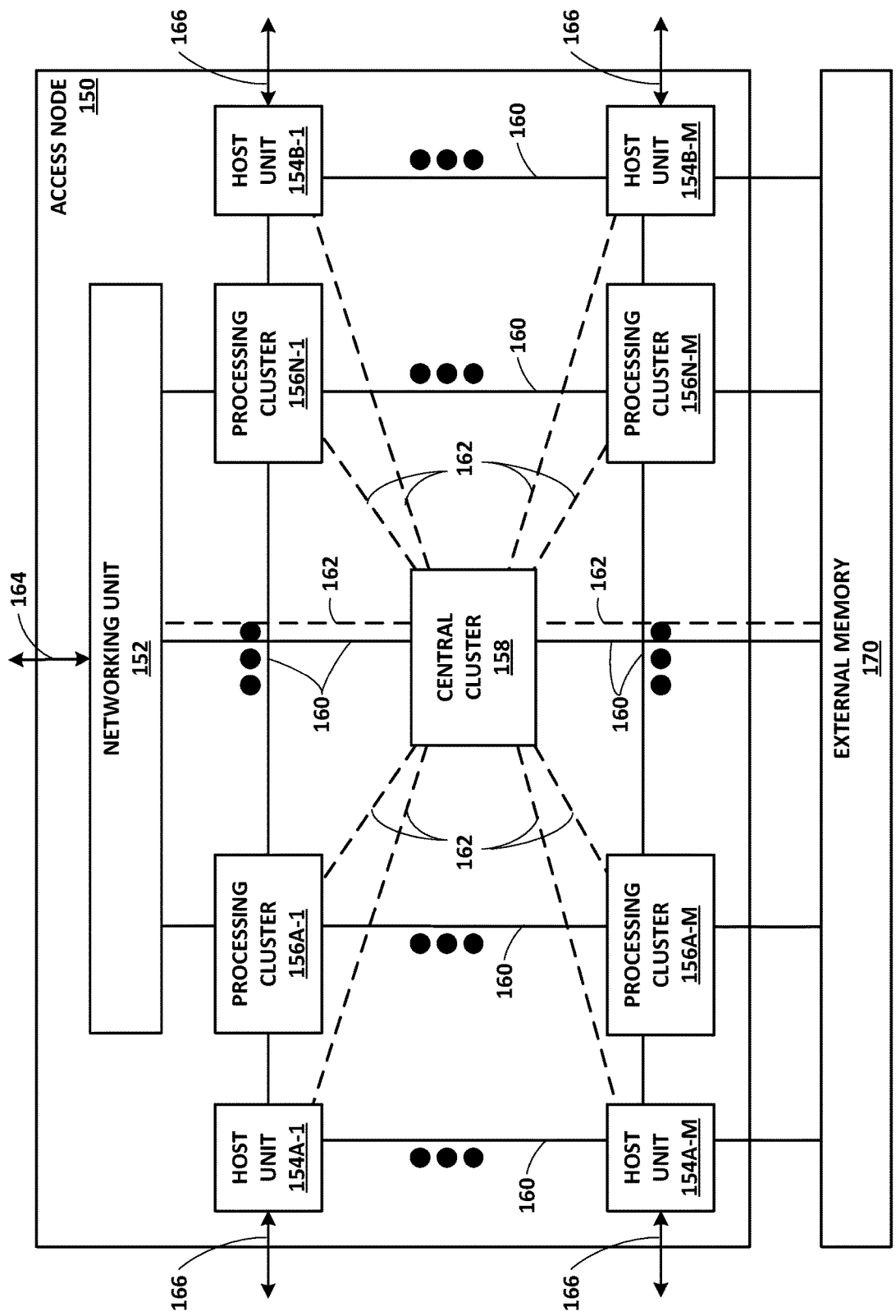
FIG. 3 is a block diagram illustrating an example data center access node including a central cluster and two or more processing clusters, in accordance with the techniques of this disclosure.

FIG. 3 is a block diagram illustrating one example of an access node 150 including a networking unit, at least one host unit, and two or more processing clusters. Access node 150 may operate substantially similar to any of the access nodes 17 of FIGS. 1 and 2. Thus, access node 150 may be communicatively coupled to a data center fabric (e.g., switch fabric 14), one or more server devices (e.g., servers 12), storage media (e.g., storage devices 27), one or more network devices, random access memory, or the like, e.g., via PCI-e, Ethernet (wired or wireless), or other such communication media in order to interconnect each of these various elements. Access node 150 generally represents a hardware chip implemented in digital logic circuitry. As various examples, access node 150 may be provided as an integrated circuit mounted on a motherboard of a computing device or installed on a card connected to the motherboard of the computing device.

In general, access node 150 represents a high performance, hyper-converged network, storage, and data processor and input/output hub. As illustrated in FIG. 3, access node 150 includes networking unit 152, processing clusters 156A-1-156N-M (processing clusters 156), host units 154A-1-154B-M (host units 154), and central cluster 158, and is coupled to external memory 170. Each of host units 154, processing clusters 156, central cluster 158, and networking unit 152 may include a plurality of processing cores, e.g., MIPS cores, ARM cores, PowerPC cores, RISC-V cores, or CISC or x86 cores. External memory 170 may comprise random access memory (RAM) or dynamic random access memory (DRAM).

As shown in FIG. 3, host units 154, processing clusters 156, central cluster 158, networking unit 152, and external memory 170 are communicatively interconnected via one or more specialized network-on-chip fabrics. A set of direct links 162 (represented as dashed lines in FIG. 3) forms a signaling network fabric that directly connects central cluster 158 to each of the other components of access node 150, that is, host units 154, processing clusters 156, networking unit 152, and external memory 170. A set of grid links 160 (represented as solid lines in FIG. 3) forms a data network fabric that connects neighboring components (including host units 154, processing clusters 156, networking unit 152, and external memory 170) to each other in a two-dimensional grid.

Networking unit 152 has Ethernet interfaces 164 to connect to the switch fabric, and interfaces to the data network formed by grid links 160 and the signaling network formed by direct links 162. Networking unit 152 provides a Layer 3 (i.e., OSI networking model Layer 3) switch forwarding path, as well as network interface card (NIC) assistance. One or more hardware direct memory access (DMA) engine instances (not shown) may be attached to the data network ports of networking unit 152, which are coupled to respective grid links 160. The DMA engines of networking unit 152 are configured to fetch packet data for transmission. The packet data may be in on-chip or off-chip buffer memory (e.g., within buffer memory of one of processing clusters 156 or external memory 170), or in host memory.

Host units 154 each have PCI-e interfaces 166 to connect to servers and/or storage devices, such as SSDs or HDDs. This allows access node 150 to operate as an endpoint or as a root. For example, access node 150 may connect to a host system (e.g., a server) as an endpoint device, and access node 150 may connect as a root to endpoint devices (e.g., SSD devices). Each of host units 154 may also include a respective hardware DMA engine (not shown). Each DMA engine is configured to fetch data and buffer descriptors from host memory, and to deliver data and completions to host memory.

Although not shown, each of central cluster 158 and processing clusters 156 may include two or more processing cores and two or more hardware accelerators. In general, hardware accelerators perform acceleration for various data-processing functions, such as look-ups, matrix multiplication, cryptography, compression, regular expressions, or the like. That is, the hardware accelerators may comprise hardware implementations of lookup engines, matrix multipliers, cryptographic engines, compression engines, regular expression interpreters, or the like. In accordance with the disclosed techniques, the hardware accelerators may also perform acceleration for additional data reduction techniques beyond compression, including erasure coding and, in some cases, deduplication and thin provisioning. More details on access nodes, including their operation and example architectures, are available in U.S. Provisional Patent Application No. 62/530,591, filed Jul. 10, 2017, entitled "Data Processing Unit for Computing Devices,", and U.S. Provisional Patent Application No. 62/559,021, filed Sep. 15, 2017, entitled "Access Node for Data Centers,", the entire content of each of which is incorporated herein by reference.

Access node 150 provides optimizations for stream processing. Access node 150 executes an operating system that provides run-to-completion processing, which may eliminate interrupts, thread scheduling, cache thrashing, and associated costs. For example, an operating system may run on one or more of processing clusters 156. Central cluster 158 may be configured differently from processing clusters 156, which may be referred to as stream processing clusters. In general, central cluster 158 executes the operating system kernel (e.g., Linux kernel) as a control plane. Processing clusters 156 may function in run-to-completion thread mode of a data plane software stack of the operating system. That is, processing clusters 156 may operate in a tight loop fed by work unit queues associated with each processing core in a cooperative multi-tasking fashion.

Access node 150 operates on work units. Work units are sets of data exchanged between processing clusters 156, networking unit 152, host units 154, central cluster 158, and external memory 170. Work units associate a buffer with an instruction stream to eliminate checking overhead and allow processing by reference to minimize data movement and copy. The stream-processing model may structure access by multiple processors (e.g., processing clusters 156) to the same data and resources, avoid simultaneous sharing, and therefore, reduce contention. A processor may relinquish control of data referenced by a work unit as the work unit is passed to the next processor in line. Central cluster 158 may include a central dispatch unit responsible for work unit queuing and flow control, work unit and completion notification dispatch, and load balancing and processor selection from among processing cores of processing clusters 156 and/or central cluster 158. More details on work units and stream processing by access nodes are available in U.S. Provisional Patent Application No. 62/589,427, filed Nov. 21, 2017, entitled "Work Unit Stack Data Structures in Multiple Core Processor System,", the entire content of which is incorporated herein by reference.

According to the techniques described in this disclosure, one or more of processing clusters 156 of access node 150 may host a data plane for performing data storage operations on a durable block device (DBD) that provides persistent storage of data blocks with inline erasure coding enabled by the hardware accelerators of processing clusters 156. Management and control planes of the DBD may be hosted on one or more servers connected to access node 150 via host units 154 or via networking unit 152. The data plane of the DBD hosted on the one or more of processing clusters 156 may communicate with the management plane and the control plane via a management agent and a control agent, respectively, hosted on central cluster 158 of access node 150.

The data plane of the DBD hosted on the one or more of processing clusters 156 of access node 150 is divided into multiple layers of functionality from application (e.g., user volume) to device (e.g., SSD storage device). The disclosed techniques include a log structured logical volume layer in the data plane of the DBD that enables performance of inline erasure coding.

The data plane of the DBD hosted on the one or more of processing clusters 156 of access node 150 handles the work load of responding to data block read and write requests received via host units 154 from applications running on the servers. For example, when a write request for a hosted volume is received on one of PCI-e interfaces 166 of host units 154 from an application running on one of the servers, the receiving one of host units 154 generates a work unit to one of processing clusters 156. In response to the work unit, the one of processing clusters 156 performs the write request to the appropriate volume hosted by access node 150. To perform the write request, the one of processing clusters 156 may propagate the work unit (or multiple work units) through the multiple functional layers of the storage stack, which may be hosted on different one of processing clusters 156 of access node 150 or on different access nodes.

The control and management agents running on central cluster 158 of access node 150 facilitate communication between the data plane of the DBD hosted on access node 150 and the control and management planes of the DBD running on the servers. In general, the number of control and management agents is a very small fraction (e.g., 1%) of the number of data plane entities hosted on access nodes. As one example, central cluster 158 of access node 150 may host a single control agent and a single management agent, while processing clusters 156 may host data planes for hundreds of DBD user volumes. Conversely, in other examples, central cluster 158 of access node 150 may host multiple control and management agents as a larger fraction (e.g., 25% or 50%) of the number of data planes hosted on processing clusters 156, or even in a one-to-one relationship between control and management agents and data planes.

Figure 4:
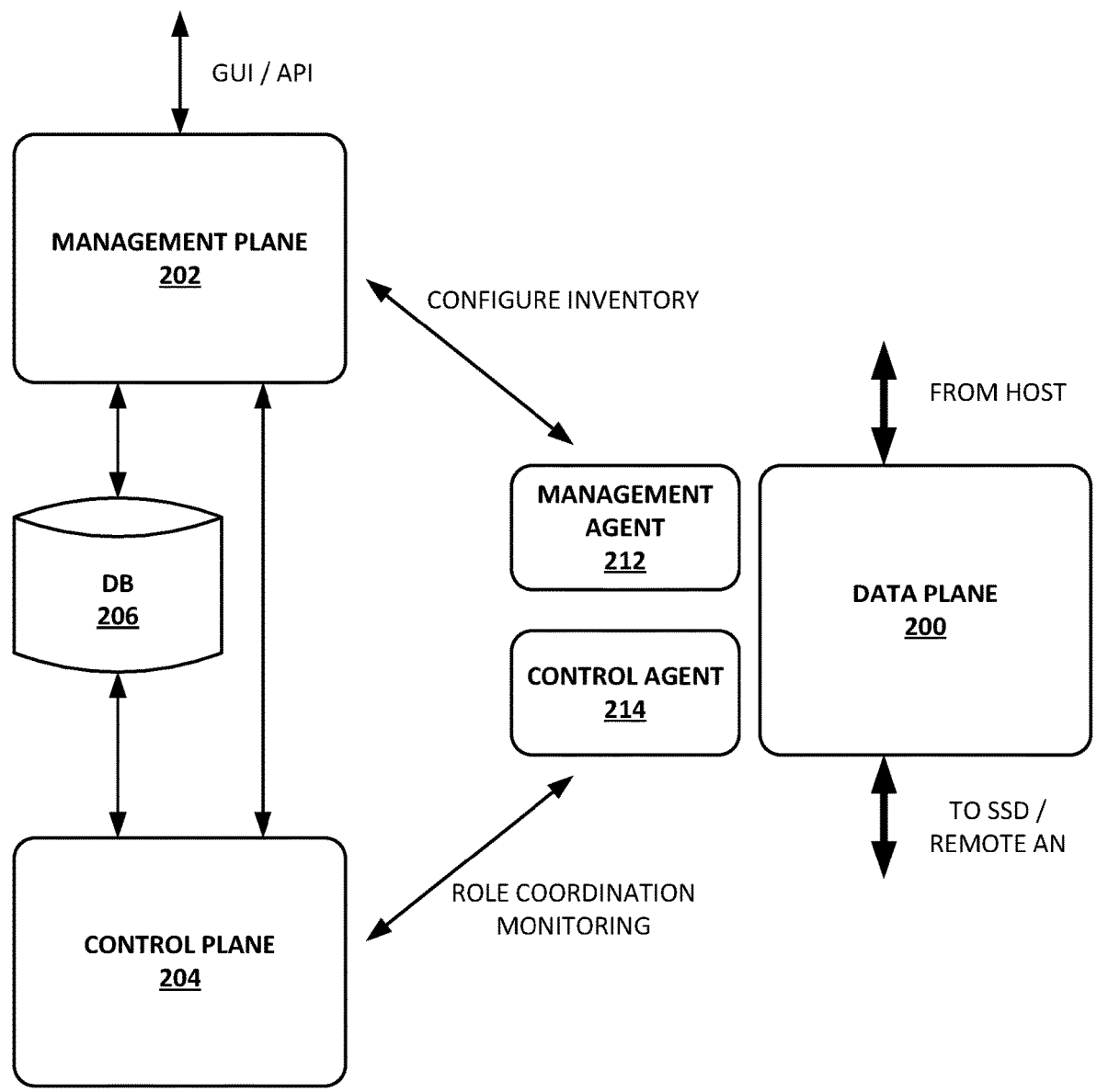
FIG. 4 is a block diagram illustrating an example system architecture of a durable block device hosted on one or more data center access nodes, in accordance with the techniques of this disclosure.

FIG. 4 is a block diagram illustrating an example system architecture of a durable block device (DBD) hosted on (i.e., provided by) one or more data center access nodes, in accordance with the techniques of this disclosure. As illustrated in FIG. 4, the DBD is composed of three major components: data plane 200, management plane 202, and control plane 204. The DBD also includes APIs (illustrated as arrows) that connect the major component to one another and to external entities.

In the example of FIG. 4, data plane 200 for the DBD is hosted on (provided by) one or more access nodes of a data center, e.g., access nodes 17 of FIG. 1 or access node 150 of FIG. 3, and comprises software and hardware modules that are inline with processing of block I/O requests. For example, access nodes 17 may be implemented as a cluster of data processing unit integrated circuits having hardware-based accelerators and processing cores configured to execute DBD I/O software for processing DBD operations (including erasure coding) inline and in real-time as data blocks are written to and/or retrieved from the DBD. The execution target for data plane 200 is the hosting access node and a scale-out model across a cluster of access nodes. Features provided by the access nodes for data plane 200 include performance (latency) and efficiency (I/O operations per second, throughput, utilization), scale (size of the cluster), data integrity, availability and durability, data security, and multi-tenancy.

Management plane 202 is hosted on one or more servers of the data center, e.g., one of servers 12 from FIG. 1, and comprises software modules executing on the servers that are responsible for configuration, resource management, and high-level lifecycle management of DBD storage volumes. One example execution target for management plane 202 is general purpose computing systems (e.g. Openstack running on one or more x86 servers) that can be scaled out for capacity and redundancy. Management plane 202 communicates with data plane 200 via a management agent 212 that resides in the access node hosting data plane 200, e.g., on central cluster 158 of access node 150, or that resides in another server. Some example advantages provided by management plane 202 include ease of management (inventory, policy, configuration, etc.) and scale (size of cluster, dynamic sizing).

Control plane 204 is hosted on another (or same) one or more servers of the data center, e.g., another or same one or more of servers 12 from FIG. 1, as management plane 202 and comprises software modules that are responsible for the low-level lifecycle of DBD storage volumes. The execution target for control plane 204 is general purpose computing systems (e.g. micro-services running on one or more x86 servers) that can be scaled and made redundant. Control plane 204 communicates with data plane 200 via a control agent 214 that resides in the access node hosting data plane 200, e.g., on central cluster 158 of access node 150, or that resides in another server. The key considerations for control plane 204 include monitoring and role coordination (failure recovery, migration, etc.) and scale (size of cluster, dynamic sizing).

When the cluster is first installed, management plane 202 may receive some administrator policies and an inventory of all resources included in the cluster, e.g., access nodes, servers, and storage devices. Management plane 202 then creates database 206 to keep track of the resources from the inventory. Management plane 202 creates a new DBD volume with certain configurable parameters, such as size (number of data blocks) and durability policy (e.g., replication and/or erasure coding). These parameters may be configured by an administrator via an API or graphical user interface (GUI) of management plane 202.

Management plane 202 talks to a number of access nodes, and instructs management agent 212 on each of the access nodes regarding which roles to play to host the DBD volume. For example, management plane 202 instructs one access node to operate as an attachment node to which an application running as a virtual machine or container on a server is connected. Management plane 202 instructs one access node to operate as a primary controller node and at least one other access node to operate as a backup controller node to ensure data consistency and availability in case the primary controller node fails. Management plane also instructs one or more access nodes to operate as storage nodes that are directly connected to the storage devices.

Once the DBD volume is generated by the access nodes, management plane 202 updates database 206 to include the new volume and the resources associated with its construction. Management plane 202 also informs the application running on the server (host) to attach to the DBD volume. Once attached, applications may send read/write commands to the DBD volume, and data plane 200 processes the read/write commands from the applications on the host.

If one of the storage devices underlying the DBD volume fails, control agent 214 tells control plane 204 that the storage device is lost, and control plane 204 in turn determines a replacement drive and tells data plane 200 via control agent 214. Control plane 204 may determine the replacement drive based in part on the information included in database 206, which acts as a "source of truth" with respect to which volumes exist in the cluster and which cluster resources are available. Control plane 204 may similar determine replacement resources for access node failures, e.g., election of a new primary controller node. Database 206 is constantly updated by management plane 202 and control plane 204 based on creation of new volumes, resource failures, and resource additions.

Figure 5:
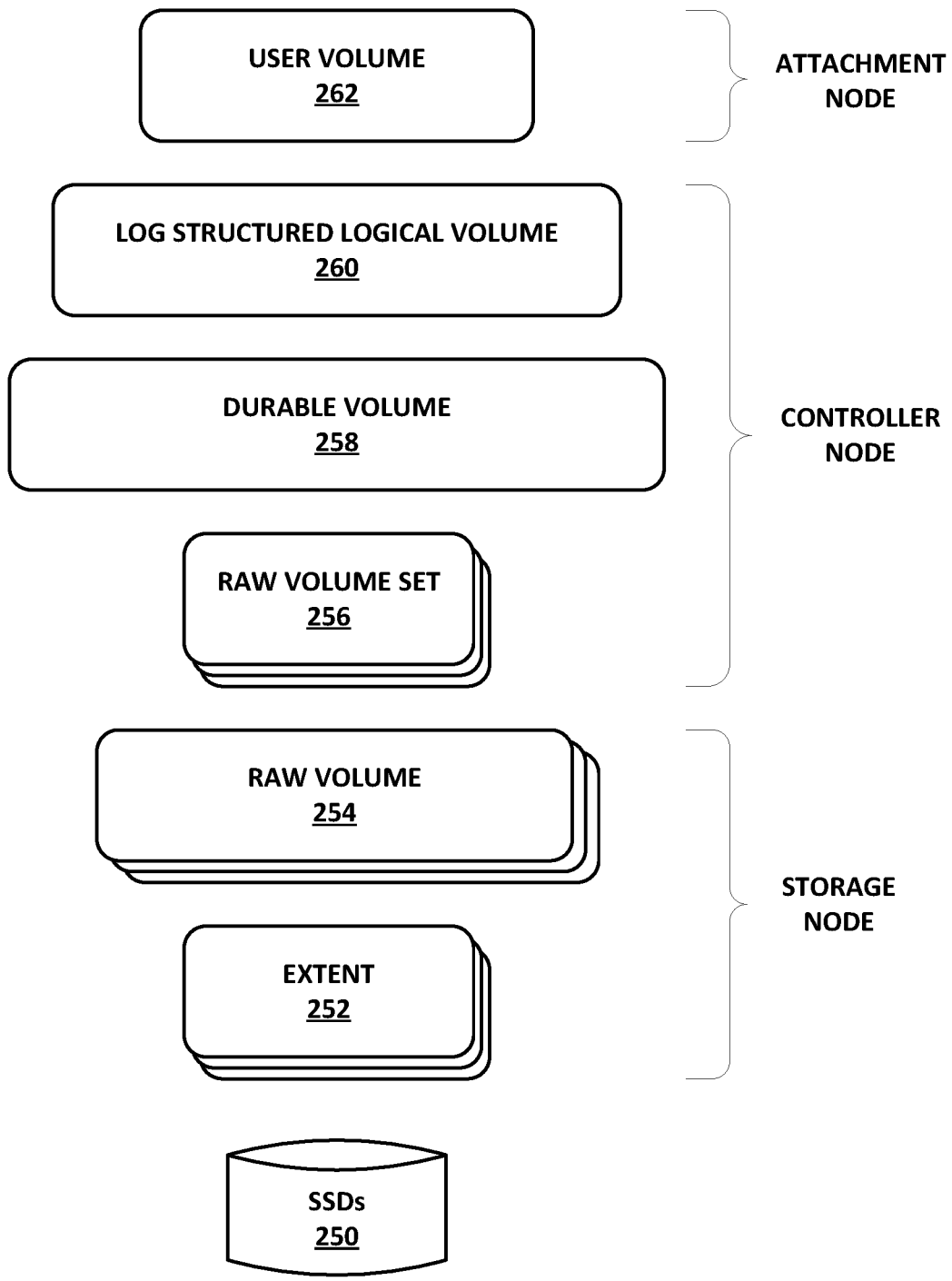
FIG. 5 is a conceptual diagram illustrating an example object model of a durable block device data plane implemented using layers of abstraction, in accordance with the techniques of this disclosure.

FIG. 5 is a conceptual diagram illustrating an example object model for a durable block device (DBD) data plane implemented via the access nodes providing the data plane using layers of abstraction, in accordance with the techniques of this disclosure. As illustrated in FIG. 5, the DBD provides layers of abstraction from SSDs 250. SSDs 250 may be a logically common pool of storage devices created by the access nodes interconnected in a cluster of a data center and accessible by all servers coupled to a switch fabric of the data center. The layers of abstraction of the DBD include multiple extent layers 252 that each maps to a portion of one of SSDs 250, multiple raw volume layers 254 that each maps to a number of extents 252, multiple raw volume set layers 256 that each maps to a number of raw volumes 254, a durable volume layer 258 that maps to multiple raw volume sets 256, a log structured logical volume layer 260 that maps to durable volume 258, and a user volume 262 that maps to logical volume 260. The distribution of data may occur at two boundaries: 1) user volume 262 to logical volume 260, and 2) raw volume set 256 to raw volume 254. In some examples, DBD can configure user volume 262 to strip/concatenate the user volume to multiple logical volumes, thereby providing a 1:N mapping of user volume to logical volumes. This may, for example, facilitate scaling of user volumes across multiple DPUs as well as scale recovery when a storage device fails.

More information about each of the layers of abstraction (from application to device) is set forth in Table 1 below. Although not shown in the examples of Table 1, as noted above, the user volume may, in some implementations, map to 1:N logical volumes.

TABLE 1

Layers of Abstraction of Durable Block Device

| Layer | Interface | API | Operations | Mapping |
|---|---|---|---|---|
| User Volume | Block (multiple of block size, e.g., 4 KB, App configured) | LBA, num blocks | QoS, Compression, Encryption | Maps to a logical volume (1:1) |
| Logical Volume (Log Structured) | Variable length blocks | LBA, Length | Log structure into units of Chunks (e.g., 2 MB) | Maps to a Durable Volumes (1:1) |
| Durable Volume | Write Block Size separate from Read Block Size (e.g., 16 KB calculated based on durability scheme) | LBA, num blocks | Replicate/ Erasure Code | Maps to Concatenation of N Raw Volume Sets (1:N) |
| Raw Volume Set | Device Blocks (multiple of device block size, e.g., 4 KB). Configured by Admin. | LBA, num blocks | Distribute data to members of the Set | Maps to N Raw Volumes based on the redundancy scheme (1:N) |
| Raw Volume | Device Blocks (multiple of device block size, e.g., 4 KB). Configured by Admin. | LBA, num blocks | Map to underlying Extent based of Offset | Maps to N Extents (1:N) |
| Extent | Device Blocks (multiple of device block size, e.g., 4 KB). Configured by Admin. | LBA, num blocks | Map to underlying Device (Controller, Namespace) | Maps to a contiguous piece from an SSD (e.g., 1 GB). |

There are three type of roles that an access node may implement in the layering illustrated in FIG. 5 and described in Table 1. Based on the deployment topology (e.g. hyper-converged vs. disaggregated) and the placement of data, a given access node may play one or all roles for a given DBD volume. The first type of role that an access node may implement is an attachment node. The attachment node is the access node where an application running as a virtual machine or container on a server attaches to the DBD volume. For example, the attachment node may be the access node where the PCIe link to the server is attached or where the NVMEoF (non-volatile memory express over fabrics) connection is terminated for the DBD volume. The user volume 262 function runs on the attachment node.

The second type of role that an access node may implement is a primary/backup controller node. The DBD includes a primary controller node and at least one backup controller node. A primary and backup scheme may be used to ensure data consistency and availability in the presence of access node failures. The primary controller node creates a transaction journal that is replicated to the one or more backup controller nodes. If the primary controller node fails, a new primary controller node is elected from the one or more backup controller nodes by the control plane (e.g., control plane 204 from FIG. 4), and the transactions are rolled forward before allowing user requests to any blocks that have outstanding transactions. The log structured logical volume 260, durable volume 258, and raw volume set 256 functions run on the controller nodes.

The third type of role that an access node may implement is a storage node. The storage node is the access node to which a storage device is attached. The DBD may include a plurality of storage nodes. For example, SSDs 250 are partitioned into extents 252 (e.g. 1 GB) and accessed via the storage node that is attached to the SSDs 250 via PCIe. Extents 252 are provisioned into a raw volume 254 that is remotely accessible by other access nodes interconnected in a cluster. Raw volume 254 and extent 252 functions run on the storage nodes.

Configuration of the DBD volume is described in more detail here with respect to FIGS. 4 and 5. The DBD volume is configured with the following steps via management plane 202 and control plane 204. Each configuration step is a communication from management plane 202 to one or more access nodes instructing the access nodes about their roles relative to the DBD volume being created. DBD volumes each have a globally unique identifier that is used in the communication so that each access node can identify the correct volume. Management plane 202 may use a variety of methods to determine which access nodes to select to play the different roles for the given DBD volume. In general, management plane 202 may select access nodes that are outside of a same fault zone within a cluster so that multiple access nodes used to support the DBD volume are not likely to fail together.

As a first step, management plane 202 receives a top-level specification from a management console (e.g. Openstack Cinder) that defines parameters of block size, volume size (number of blocks), quality of service (QoS), encryption, compression, and durability (e.g. replication factor or erasure coding scheme). As a second step, management plane 202 creates raw volumes 254 on each storage node. Raw volumes 254 are created by assigning extents 252 from available SSDs 250. Extents 252 may be statically sized (e.g., 1 GB) during deployment. This step may be done statically or dynamically (e.g., thin provisioning) as the storage space is accessed by the storage node.

As a third step, management plane 202 creates raw volume sets 256 on each controller node. The number of raw volumes per raw volume set 256 may depend on the durability scheme specified in the top-level specification for the DBD volume (e.g., X for replication factor and M+N for erasure coding). The number of raw volume sets 256 may depend on the size of the raw volumes 254 and the required size specified in the top-level specification for eth DBD volume. As a fourth step, management plane 202 creates durable volume 256 on each controller node. Parameters for durable volume 256 include durability scheme (e.g., replication or erasure coding) and volume size (including additional space to allow for log compaction).

As a fifth step, management plane 202 creates log structured logical volume 260 on each controller node. Parameters for log structured logical volume 260 include chunk size, and volume size and compaction related parameters. Log structured logical volume 260 is a logical volume management (LVM) compatible volume type in the data plane storage stack. Log structured logical volume 260 provides fault resiliency and flash optimization for the DBD, and can also provide flash optimization for a raw block device without resilience. In accordance with techniques of this disclosure, log structured logical volume 260 is used to gather multiple data blocks into larger chunks of data for inline erasure coding by durable volume 256 prior to storage across multiple storage nodes. Note that primary and backup controller nodes are managed by control plane 204 separate from the creation by management plane 202.

As a sixth step, management plane 202 creates user volume 262 on each attachment node. User volume 262 receives the read and write requests for data blocks from an application running on an attached server, and passes the read and write requests to log structured volume 260 for processing. Parameters for user volume 262 include block size, encryption keys, compression scheme, and volume size.

Once created, the DBD volume may rely on a distribution protocol to exchange data between the associated access nodes. For example, NVMEoF may be used as the base protocol. The network binding may be based on transmission control protocol (TCP) or some form of reliable datagram. In one example, the network binding may be TCP with fabric control protocol (FCP) based congestion control. More information on FCP is available in U.S. Provisional Patent Application No. 62/566,060, filed Sep. 29, 2017, entitled "Fabric Control Protocol for Data Center Networks with Packet Spraying over Multiple Alternate Data Paths,", the entire content of which is incorporated herein by reference.

The following objects may have a universally unique identifier (UUID) that allows them to be addressable across the network via the distribution protocol. First, log structured logical volume 260 may be accessed using an UUID from the attachment node or directly via an NVMEoF client. Second, raw volumes 254 may receive I/O requests from raw volume sets 256 for replicas or erasure coded pieces storage in raw volumes 254 identified by UUIDs. In some examples, authentication may be included as a part of NVMEoF to ensure that a "bad actor" on the network cannot access these remotely addressable entities.

In some alternative examples, the DBD designs described in this disclosure may support a scale-down model all the way down to a single access node. In this case, all raw volumes 254 are allocated from the local access node resulting in a device that is similar to a RAID (redundant array of independent disks) or an embedded erasure code implementation that is still tolerant of SSD failures.

Figure 6:
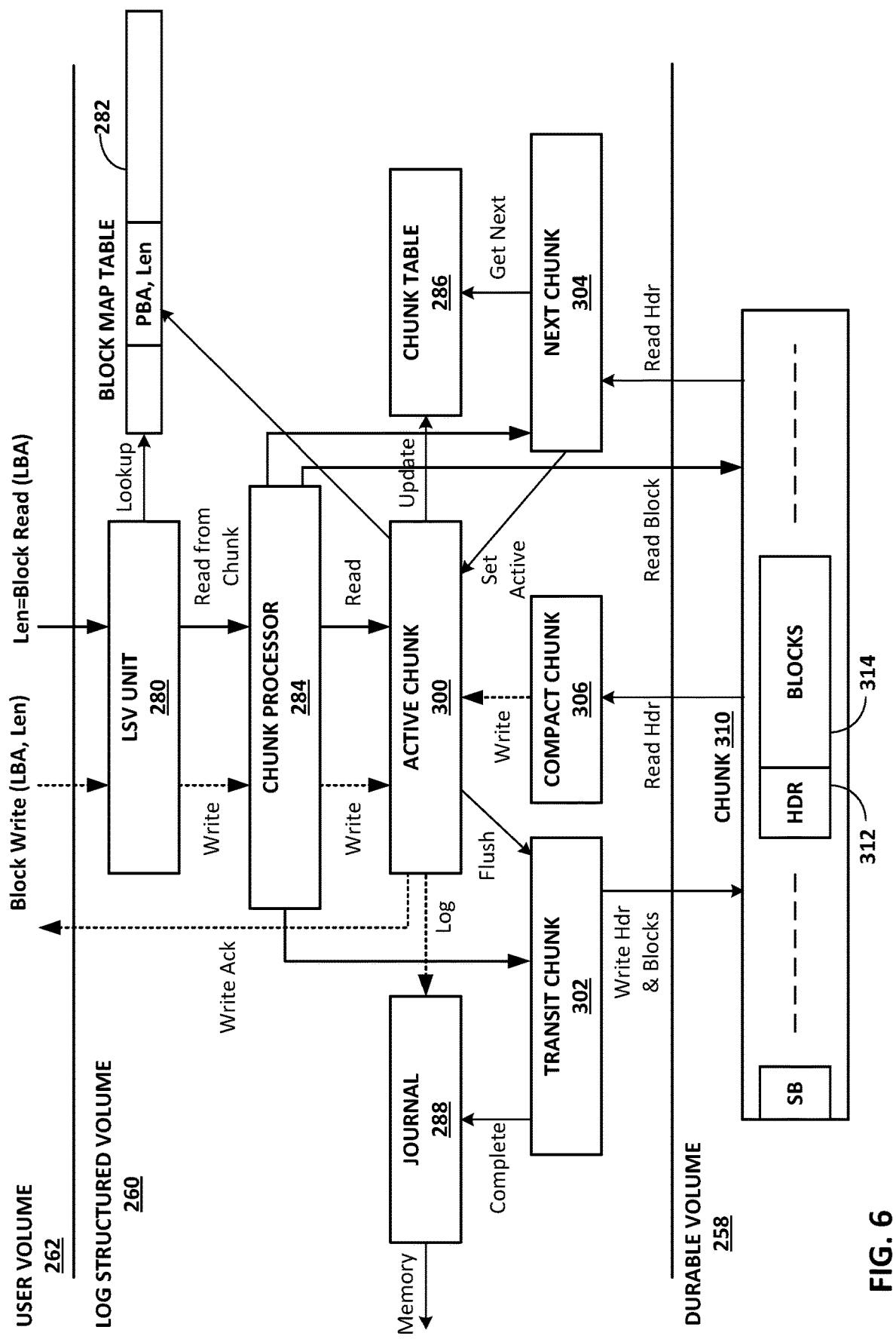
FIG. 6 is block diagram illustrating an example implementation (e.g., data structures and state machines) of a log structured volume included in a durable block device, in accordance with the techniques of this disclosure.

FIG. 6 is block diagram illustrating an example implementation (e.g., data structures and state machines) of a log structured volume included in a durable block device (DBD), in accordance with the techniques of this disclosure. The example illustrated in FIG. 6 includes a more detailed view of user volume 262, log structured volume (LSV) 260, and durable volume 258 of FIG. 5. FIG. 6 further illustrates example interactions of LSV 260 with user volume 262 for read and write operations, and how log structured volume 260 organizes blocks in the underlying storage volume. In the illustrated example of FIG. 6, the underlying storage volume, which is the target volume from which LSV 260 performs read and write operations, is durable volume 258. In other examples, the underlying storage volume may be any volume type supported by LVM, including a raw volume or a remote volume.

As described above, the techniques of this disclosure are directed to various implementations of a DBD hosted on one or more data center access nodes and configured to provide persistent storage of data blocks with inline erasure coding enabled by the hardware engines of the access nodes. More specifically, the techniques of this disclosure are directed to the creation of a log structured volume at a layer between a durable volume and a user volume in the DBD that is configured to gather multiple data blocks into larger chunks of data for inline erasure coding prior to storage across multiple storage devices.

LSV 260 may be used to compose a storage stack of varying features via LVM. LSV 260 supports a standard data path API, but with some specific behaviors that affect the layer above and below are as follows. For input, LSV 260 supports variable length writes to a logical block address (LBA), thus allowing for compression in user volume 262 or other layers above LSV 260. LSV 260 may not support multiple LBAs in a single request or I/O vectors. For output, LSV 260 allows a definition of a "group" that is an aligned set of LBAs. Writes from LSV 260 are done in groups of LBAs with an attempt to write all LBAs in the group in order to avoid a "read-modify-write." However, this cannot be guaranteed for all workloads and the storage volume layer below LSV 260, e.g., durable volume 258, must be able to deal with missing LBAs within a group. LSV 260 achieves the goals of sequential consistency for block storage in a scale-out model, data reduction using compression and erasure coding, SSD optimization with larger writes and less amplification, and write latency optimization.

The design of LSV 260 includes the elements of journaling and log structuring. For the journaling element, LSV 260 may use an intent log (for both data and meta-data) to ensure that any write that is acknowledged to the host server for the application can be reliably performed to the underlying storage media in the presence of component failures. The log (i.e., journal 288) may be stored in NVDIMM (non-volatile dual in-line memory module) to support high performance and bandwidth. The journal 288 is replicated to another access node to ensure resilience to an NVDIMM/access node failure. For the log structuring element, LSV 260 may organize updates in a log structure on the underlying storage media to allow aggregation of variable sized writes into a "group" of LBAs.

In general, the techniques described in this disclosure determine how to compress blocks of data into variable size pieces, and organize them to enable inline erasure coding of larger pieces while maintaining consistency. Traditionally, when applications make changes to storage volumes (e.g., write to any block in any order with a random write pattern), performance of compression and erasure coding would result in tiny pieces of data that would be very inefficient to store in flash memory. The log structuring element of LSV 260 reorganizes the data to coalesce the data that is updated in time order (i.e., the order in which the data arrives at flash) instead of based on block address. In other words, the log structuring element is implemented by grouping together writes to a DBD volume with temporal locality into a contiguous area in the storage volume. The log structuring element creates a layer of mapping between receipt order of the data (i.e., location of write pointer) and the address of the block. In order to handle this mapping, LSV 260 is configured to keep state about the mapping between a logical block address (LBA) of the data block seen by the application attached to user volume 262 and a logical volume address (LVA) on flash memory.

LSV 260 is managed in chunks that are sized into flash friendly update units that amortize meta-data overhead, and constrained by buffering, NVDIMM capacity, and management complexity (e.g., constrained to a size between 512 KB and 128 MB). The default size of a chunk may be 2 MB, for example. Chunks are updated in a circular fashion (oldest next) in general, but strictly sequential operation is not required. Each complete chunk 310 has a header (i.e., a chunk header) 312 and a sequence of blocks 314. The header 312 contains a map of logical to physical blocks (e.g., offset within the chunk) and an update timestamp. In order to minimize writes, the header is only written once when the complete chunk is flushed (i.e., written back to flash).

Active chunk 300 is the current region of the DBD volume on which write operations are being performed. Active chunk 300 defines the location of the current write pointer and where new blocks are going to be added when written. At any time in log structured volume 260, there is one active chunk 300 that is read-write and one or more read-only transit chunks 302 that are in the process of being written back from memory to flash. The updates to the active chunk 300 are recorded in a journal 288 in NVRAM (non-volatile random access memory) for crash resilience. The records of journal 288 are marked completed once transit chunk 302 has been flushed to flash. For the active chunk 300, chunk processor 284 keeps track of the free blocks within the chunk that can be assigned to subsequent write requests using a data structure called a chunk map (not shown). The chunk map is small (e.g., on the order of KBs or less) and may be stored in an external memory, e.g., external memory 170 of access node 150 of FIG. 3.

A block map table 282 maps LBA to LVA and also caches the (compressed) length for each data block. As an example, for a 4 KB block size and 96 TB of total flash capacity, block map table 282 may have 24 billion entries. The chunk may be compacted (i.e. blocks relocated within the chunk) to address fragmentation. This will be reflected in the block map table 282. The block map table 282 may be stored in external DRAM as a full cache to provide fast translation for reads. Updates (due to writes and compaction) are done to chunk data structures in external memory and reflected back to the block map table 282.

Whenever a block is updated, the updated block may go in its existing location if the block was already in the active chunk 300 or a new location for the updated block may be allocated via the chunk map. The previous location (read from the block map table 282) is now free. The count of free blocks in each chunk is tracked in the chunk table 286 and is used to select the next active chunk, i.e., next chunk 304. The chunk table 286 may be stored in a priority queue using a structure similar to a binary heap. As an example, for a chunk size of 2 MB and 96 TB total flash capacity, chunk table 286 may have 48 million entries. The chunk table 286 may be stored in external memory.

In steady state, active chunk 300 will have some blocks that are free. This is determined by comparing the chunk header with the block map table 282. In addition, LSV 260 may perform two background activities related to the chunks to ensure a steady stream of active chunks with free blocks at which to perform write operations. The chunks may be compacted by maintaining current or valid versions of data blocks in active chunk 300, and discarding old and invalid versions of the data blocks. As a first background activity, each time transit chunk 302 is flushed to the storage volume, a compact chunk 306 is selected from the chunk table 286. An attempt is made to free entire blocks (or even groups) of blocks in the compact chunk 306 by determining the valid versions of the data blocks, and moving the valid versions of the data blocks from compact chunk 306 into the current active chunk 300 (by doing a normal read and write of the valid LBAs of the blocks). In this way, free space is created in compact chunk 306 for its subsequent selection and use as an active chunk. The selection of the LBAs to move to the active chunk 300 may be based on a threshold of used space within each of the blocks. The LBA selection process may be evolved over time to be more adaptive to the data within the chunk and the workload. As another background activity, the next chunk 304 is selected to become the active chunk 300 by retrieving the best candidate from the chunk table 286 and preparing a list of free blocks within the next chunk 304.

In some examples, additional techniques may be applied to tune data compaction. As one example, LSV 260 may keep "hot" and "cold" data separate when building the chunks. Many workloads exhibit a write pattern that has a small working set. In order to avoid having to move "cold" blocks multiple times, LSV 260 may accumulate the cold blocks together either as part of a "cold chunk" or within a specific region of each chunk (e.g. towards the end of the chunk). As another example, LSV 260 may perform compaction within compact chunk 306 rather than the active chunk 300.

After an access node restart (e.g., after a crash or a shutdown), the various memory tables, i.e., the block map table 282, the chunk table 286, and the chunk map for the active chunk 300, need to be reconstructed. This reconstruction may be done by reading the chunk header 312 for each chunk from flash.

With respect to the journaling element of LSV 260, each LBA write to the active chunk 300 is recorded as a new transaction to journal 288 before it is acknowledged to the host server for the application. The record in journal 288 contains the data as well as the meta-date in the chunk for the LBA. As the transit chunk 302 is flushed to the storage volume, e.g., durable volume 258, the corresponding transaction in journal 288 is marked as complete. After an access node restart, any transactions included in journal 288 that have not been completed are replayed by updating the corresponding chunk. Note that this process may take place on the same access node where the volume was previously mounted or on a new access node where the journal was replicated.

Once a chunk is complete and written to durable volume 258, the chunk 310 may be erasure coded. Durable volume 258 implements an erasure coding (EC) block as the unit of erasure coding. The size of the EC block is determined by the erasure coding scheme specified in the top-level specification for the DBD volume. As one example, a desired resulting size of each erasure coded piece of data may be 4 KB, so the EC block size may be set equal to 4 KB*M, where the erasure coding scheme is M+N. As described above, the protection provided by a given erasure coding scheme may be represented as M+N, where the variable M is the original amount of data and the variable N is the extra or redundant data added to provide protection from failures. For example, for a 4+2 erasure coding scheme, the EC block size is 16 KB. As another example, for a 32+8 erasure coding scheme, the EC block size is 128 KB.

In the layer beneath durable volume 258, raw volume set 256 is the unit for allocation and recovery for erasure coded pieces. Raw volume set 256 is a set of raw volumes 254 that store the erasure coded pieces across the storage nodes assigned for the DBD volume. As described above, management plane 202 may select or assign access nodes that are within separate fault zones of a cluster to operate as the storage nodes for the DBD volume such that multiple of the storage nodes will not fail together. The size of extents 252 is configurable for a deployment and typically in the IGB range. The size of the raw volumes 254 is also configurable and is expected to be in the tens to 100s of GB and related to the size of durable volume 258. A larger size for each of raw volumes 254 may reduce a probability of failure of the durable volume 258 as a whole because the larger raw volumes result in a smaller number of raw volume sets 256. Conversely, a smaller size for each of raw volumes 254 may reduce recovery time after failure as the smaller raw volumes result in more storage nodes capable of participating in the recovery.

Erasure coding may be used for the DBD in the following scenarios. In a write scenario, all writes to the DBD may be erasure coded for volumes where erasure coding is selected as the redundancy mechanism in the top-level specification. The DBD, however, is not performing erasure coding inline with every write operation. Therefore, latency of erasure coding is not a direct factor. When log structured volume 260 attempts to flush active chunk 300, the erasure coding bandwidth needs to match the aggregate write bandwidth for all the DBD volumes for which a given access node is the primary controller node.

In a read scenario, erasure coding may be done inline when data blocks are read from a raw volume set 256 with a failed (or inaccessible) extent 252 where the target LBA resides. The overhead should be kept to a small number of microseconds for a 4 KB read, for example. In addition, the bandwidth requirement for erasure coding should be a small fraction of the total read bandwidth being provided for all the volumes for which a given access node is the primary controller node. As an example, for a 4+2 erasure coding scheme, a worst case may be a failure (or inaccessibility) of 33% of the devices.

In a rebuild scenario, when one of SSDs 250 fails, all extents 252 on the failed SSD that were allocated to DBD volumes must be reconstructed on the other SSDs. In some examples, the recovery process may be complete in under a minute. The DBD design includes spreading the extents 252 of many SSDs 250 to avoid an I/O bottleneck. Based on the allocation of extents 252 to user volume 262 and the assignment of the primary controller role, the erasure coding calculations may also be spread across the access nodes.

Erasure coding may be performed in the access node assigned the primary controller role for the DBD volume. The erasure coding throughput may be sized based on the aggregate I/O rates averaged across the access nodes (assuming that control plane 204 can balance the primary controller roles for different DBD volumes across the available set of access nodes).

In some alternative examples, deduplication may be implemented as another data reduction technique, in additional to compression and erasure coding, at a layer above log structured logical volume 260 by maintaining a fingerprint database of blocks being written to log structured logical volume 260. If a match is found in the fingerprint database during a write, log structured logical volume 260 will store the fingerprint rather than the block itself and increment a reference count in the fingerprint database.

An example write sequence will now be described with respect to FIGS. 5 and 6. An application running on a server and attached to the attachment node of the DBD volume sends a write request to the DBD volume as Write (LBA=100, Num Blocks=1), with a block size equal to 4 KB, for example. The LBA is the logical block address of the data block as seen by the application. User volume 262 of the DBD volume adds an integrity check (e.g., cyclic redundancy check (CRC)), compression, and encryption. The resulting data length is less than or equal to the block size, e.g., 3 KB. User volume 262 then sends a write request to log structured logical volume 260 as Write(LBA=100, Len=3 KB). Len stands for the block length or block size. In some examples, the CRC is stored in a block header along with the data for the block. Moreover, the block header may be packed inline along with the block data in chunk, thereby allowing bot the block header and the data to be retrieved in a single read.

Log structured logical volume 260 hosted on the primary controller node appends data to active chunk 300 and updates the block map table 282 and the chunk header of active chunk 300. More specifically, a log structured volume (LSV) unit 280 performs a lookup in block map table 284 based on the LBA of the block, determines a current location of the block in active chunk 300 (e.g., a chunk offset) if the LBA is found in block map table 282, and selects chunk processor 284 to add the block to active chunk 300. Chunk processor 284 adds the block to the determined location or allocates a new location for the block in active chunk 300. The location in active chunk 300 may be identified as an offset within the chunk.

Upon updating active chunk 300 with the data block, journal 288 is updated and the update is replicated to the one or more backup controller nodes of the DBD. The write operation is then acknowledged back to the application via user volume 262 as being complete. In addition, block map table 282 and chunk table 286, which tracks a count of free blocks left in active chunk 300, are updated to reflect the addition of the block to active chunk 300.

A flush may occur when the active chunk 300 is full (as determined by chunk table 286) or a timer expires since the last write. The timer may ensure that data in active chunk 300 does not remain in NVDIMMs for an extended period of time without being protected by the configured erasure coding scheme. During a flush, the active chunk becomes the transit chunk 302. A sequence of write operations are performed from transit chunk 302 to chunk 310 in durable volume 258 as Write(LBA=Chunk Offset, Num Blocks=1). Write blocks may be of size equal to 16 KB for a 4+2 erasure coding scheme, and of size equal to 128 KB for a 32+8 erasure coding scheme. The entries for transit chunk 302 in journal 288 are then marked complete, and the one or more backup controller nodes of the DBD are also updated.

Durable volume 258 computes raw volume set 256 and an ES offset. Durable volume 258 then performs erasure coding on the data of chunk 310, which, for example, results in 6 erasure coded pieces of 4 KB for a 4+2 erasure coding scheme or 40 erasure coded pieces of 4 KB for a 32+8 erasure coding scheme. Durable volume 258 then sends a write request to raw volume set 256 as Write(ES, ES Offset, Num Blocks=1). Raw volume set 256 distributes the data to each underlying raw volume 254, and each raw volume 254 maps a raw volume offset to the underlying extents 252. Each of the extents 252 computes the LBA for its underlying one of SSDs 250, and sends a write request as Write(Device LBA, Num Blocks=1) with block size=4 KB, for example.

An example read sequence will now be described with respect to FIGS. 5 and 6. An application running on a server and attached to the attachment node of the DBD volume sends a read request to the DBD volume as Read(LBA=100, Num Blocks=1), with a block size equal to 4 KB, for example. User volume 262 then sends a read request to log structured logical volume 260 as Read(LBA=100, Max Length=4 KB).

At log structured logical volume 260 hosted on the primary controller node, LSV unit 280 maps the LBA of the block to the LVA of the block in flash via block map table 284. If, based on block map table 284, the data block is determined to be present in the active chunk 300, chunk processor 284 reads the data block from the active chunk 300. If the data block is not present in active chunk 300, chunk processor 284 sends a read request to durable volume 258 as Read(LBA=LVA, Length from block map table 284). In response to the read, durable volume 258 may return the length for the data block as it was written in durable volume 258.

Durable volume 258 computes raw volume set 256 and an ES offset. Durable volume 258 then sends a read request to raw volume set 256 as Read(ES, ES Offset, Num Blocks=1). Raw volume set 256 retrieves the data from raw volumes 254, some of which may be remote. Each raw volume 254 maps a raw volume offset to the underlying extents 252. Each of the extents 252 computes the LBA for its underlying one of SSDs 250, and sends a read request as Read(Device LBA, Num Blocks=1) with block size=4 KB, for example. User Volume 262 receives the read data block, and then decrypts, decompresses, and validates (e.g., using checksum or CRC) the returned data block. The resulting data length should be equal to a volume block size.

In some cases, the DBD may receive large read and write requests. For example, multi-block read and write requests may be broken down into block size units at the level of user volume 262 and sent down to the lower layers as a sequence of requests. This allows for consistent treatment of blocks for compression, encryption, etc. Aggregation of blocks from a read/write perspective may occur at the level of raw volumes 254. Multiple read/write requests for contiguous blocks may be merged at the level of raw volumes 254 to optimize the requests that are sent down to the SSDs 250.

Failure handling in the DBD will now be described. In the case where one of raw volumes 254 fails to complete a write request, the EC block write may be retried (possibly with some back off) until the raw volume is marked as failed (either by control plane 204 or as a result of exceeding some configured threshold). Once the one of raw volumes 254 is marked as failed, subsequent writes will exclude that raw volume. The number of failed raw volumes that can be tolerated before the raw volume set 256 fails may be based on the redundancy setting (e.g., replication or erasure coding scheme). There may be cases (e.g. bad block failures) where the failed raw volume itself can recover by remapping an underlying one of extents 252 on the SSDs 250. This may result in faster recovery as only the single one of extents 252 needs to recover.

In the case where one of raw volumes 254 fails to complete a read request within a configured threshold, the read request is instead performed from a selection of the remaining raw volumes 254 within the raw volume set 256 and erasure coding is done to recover the data. This erasure coding based recovery may also occur if the target raw volume has already been marked as failed due to a previous operation or via control plane 204.

In the case where one of SSDs 250 is marked as failed, all the raw volumes 254 allocated on the failed SSD are lost. Control plane 204 may allocate new raw volumes to replace the failed raw volumes in a manner that preserves the residency and distribution properties desired for each raw volume set 256. Once the raw volume set map is updated, a background task may be started to recover the raw volumes from the other members of the raw volume set 256. The recovery process needs to synchronize with any reads/writes that are issued by the application.

In one example, a DBD volume is composed of a number of raw volume sets 256. If a given raw volume set fails (i.e. there are more SSD/storage node failures than can be tolerated by the raw volume set's redundancy scheme), the raw volume set failure may result in loss of data in the DBD volume. The likelihood of such a failure taking place may be reduced by assigning a desired level of redundancy as well as selecting components across fault zones in the cluster. As an example, the unique number of possible combinations of M disks from a population of N is: c(M, N)=N!/M! (M−N)!, e.g. c(3, 1000)=160 million.

The probability of a given raw volume set failing is the inverse of that number. The probability of the DBD volume failing is proportional to the number of raw volume sets 256 it contains. The desired probability may be achieved by selecting an appropriate size for each of raw volumes 254, which determines the number raw volume set members in the DBD volume. A larger raw volume set will, however, increase the rebuild time after a failure.

In the case where the attachment node, i.e., the access node at which the application running on a server attaches to the DBD volume, fails, the result may depend on the deployment model on which the DBD is built. In a hyper-converged deployment model in which the different roles for the DBD are spread across multiple different access nodes in a cluster, the failure of the attachment node may result in loss of access to the user volume 262 (and other functions) to the host server for the application. Either the server or the access node may recover and re-attach the DBD volume, or the application may be recovered on another server or access node. In this case, data loss should not occur as the data is cached and managed on the primary controller node, which is a different access node than the attachment node. In the disaggregated model, the attachment node may be the same access node as the primary controller node. Failure of the primary controller node is described below.

A failure of the primary controller node may result in a failover to one of the backup controller nodes, which is then promoted to be the new primary controller node. Control plane 204 may manage the change in roles and communicate the new roles to the access nodes as well as to the clients (e.g., user volume 262 on the attachment node or NVMEoF on the server). The new primary controller node is responsible for flushing any uncommitted transaction from journal 288 to flash memory.

A failure of one of the backup controller nodes is transparent to the clients. Control plane 204 manages the assignment of a new backup controller node. The primary controller node then updates the new backup controller node with any outstanding transactions that may have occurred before it can become a viable backup controller node (i.e. capable of taking on the primary role). It may be configurable behavior whether the primary controller node allows write operations with no backup controller node present.

The failure of a storage node may result in effective failure of the attached SSDs. In that case, the recovery process for SSD failures (described above) applies. As an optimization, if the storage node recovers within a configurable window, the SSDs may be re-instantiated. This may be dependent on the time the current chunk can be held in the primary controller node before it needs to be flushed.

Figure 7:
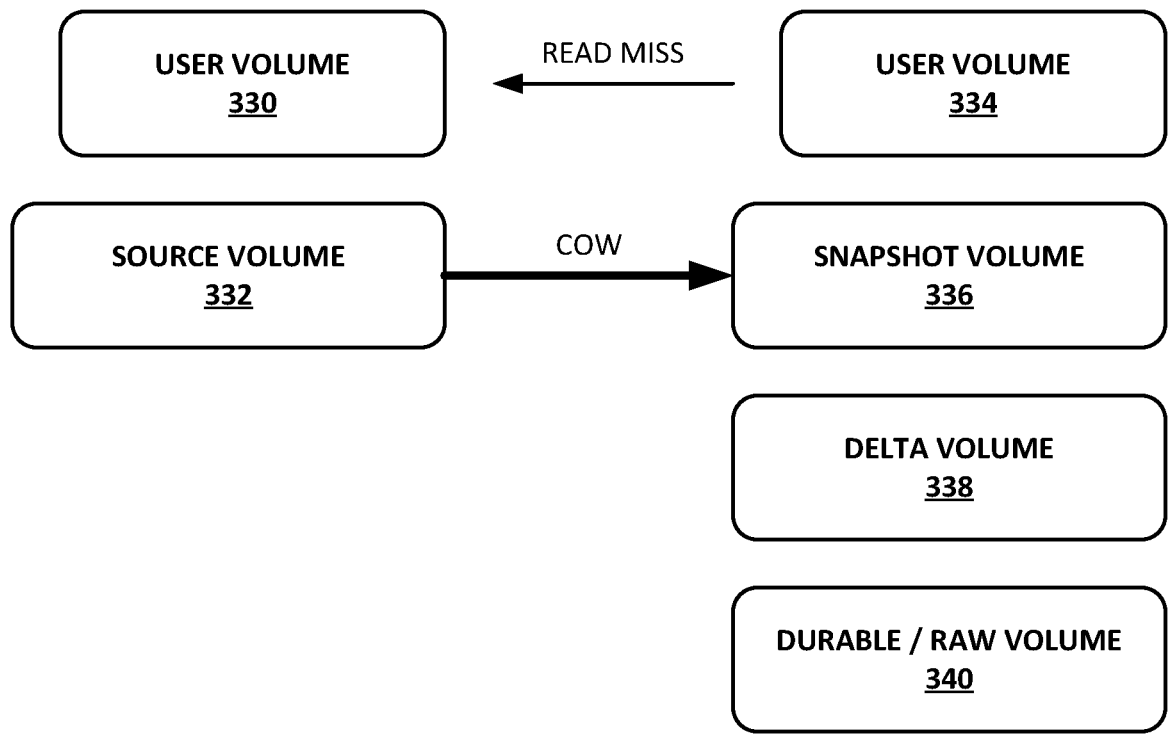
FIG. 7 is a block diagram illustrating an example snapshot model for a durable block device, in accordance with the techniques of this disclosure.

FIG. 7 is a block diagram illustrating an example snapshot model for a durable block device (DBD), in accordance with the techniques of this disclosure. A snapshot is implemented similarly for a Reliable Autonomic Distributed Object Store (RADOS) block device (RBD) and the DBD. As illustrated in FIG. 7, a new volume, snapshot volume 336, is created that is a point in time copy of source volume 332. Snapshot volume 336 consists of two volumes: source volume 332 from which it is derived and a delta volume 338 for all blocks that have been modified in the source volume 332 or the snapshot volume 336 after the snapshot was taken. The blocks of the delta volume 338 are stored in a durable or a raw volume 340 that is allocated for the snapshot.

After a snapshot is taken, any write done to source volume 332 results in the previous copy of the data being sent to snapshot logical volume 336 (i.e., copy-on-write (COW)). In this way, the previous copy of the data is stored to snapshot volume 336 before it is overwritten in source volume 332 with new information. The COW approach typically requires three I/O operations for each write: one read and two writes. Prior to overwriting a data block in source volume 332, its previous value is read from source volume 332 and then written to snapshot volume 336, followed by the write of the new information to source volume 332.

Snapshot volume 336 may be mapped as a user volume 334 so that it can be copied to an external storage system (e.g. an object store or a backup system) or be used as a block device by an application. If snapshot volume 336 is writeable, any writes done to it are also recorded in a delta map of delta volume 338. A read from the snapshot volume 336 is serviced via the delta map of delta volume 338 if present. If the delta map of delta volume 338 is not present and a read miss occurs, the read is serviced from the source volume 332 via a user volume 330.

Various examples have been described. These and other examples are within the scope of the following claims.

What is claimed is:

1. A method comprising:
executing, by one or more processing cores of a plurality of programmable processing cores included in a data processing unit (DPU) integrated circuit, data plane software for a durable block device providing persistent, redundant, block-level storage of data blocks within multiple volumes virtualized from one or more storage devices in communication with a host unit interface of the DPU integrated circuit, wherein, to provide durability for the durable block device, one or more hardware-based accelerator units implemented in the DPU integrated circuit are configured to perform inline erasure coding as a data redundancy technique for storage of the data blocks over the multiple volumes of the storage devices;

receiving, from an application, a write request for a data block to the durable block device;

updating a data chunk to include the data block, wherein the data chunk includes a sequence of data blocks and a chunk header that maps logical block addresses of the data blocks to physical locations in the data chunk;

based on the data chunk reaching a maximum size or a timer expiring, invoking the one or more hardware-based accelerator units to perform erasure coding of the data blocks included in the data chunk; and storing erasure coded pieces of the data blocks over the multiple volumes of the storage devices.

2. The method of claim 1, further comprising performing at least one of compression or deduplication of the data block prior to inclusion in the data chunk.

3. The method of claim 1, wherein updating the data chunk to include the data block comprises:
   determining, based on a block map table and a logical block address of the data block, whether the data block has a current location in the data chunk;
   adding the data block to the current location in the data chunk or allocating a new location in the data chunk for the data block if no current location is found for the data block;
   recording the update to the data chunk in a journal;
   sending an acknowledgment of the write operation for the data block back to the application;
   updating the block map table with the current location of the data block in the data chunk; and
   updating a chunk table that tracks a count of free blocks in the data chunk.

4. The method of claim 3, wherein the data chunk is an active data chunk, and wherein, based on the active data chunk reaching the maximum size or the timer expiring, the active data chunk becomes a transit chunk and is flushed to storage, the journal records are marked as complete, and a next data chunk becomes the active data chunk.

5. The method of claim 1, wherein the data chunk is an active data chunk, the method further comprising selecting a compact data chunk, determining valid versions of data blocks in the compact data chunk, and moving the valid versions of the data blocks from the compact data chunk into the active data chunk, wherein moving the valid versions of the data blocks from the compact data chunk creates free space in the compact data chunk for its subsequent use as an active data chunk.

6. The method of claim 1, further comprising:
   receiving, from the application, a read request for another data block from the durable block device;
   determining, based on a block map table and a logical block address of the another data block, whether the another data block is present in the data chunk;
   if the another data block is present in the data chunk, reading the another data block from the data chunk; and
   if the another data block is not present in the data chunk, sending a read request to the volumes of the storage devices, wherein the read request includes a logical volume address of the another data block determined from the block map table.

7. The method of claim 1, further comprising creating the durable block device in a data center including a plurality of access nodes, a plurality of servers, and a plurality of storage devices including the one or more storage devices, wherein creating the durable block device comprises:
   selecting, by a management plane hosted on one or more of the servers, one of the access nodes to operate as an attachment node of the durable block device where the application attaches to the durable block device;
   selecting, by the management plane, one of the access nodes to operate as a primary controller node of the durable block device and at least one of the access nodes to operate as a backup controller node of the durable block device; and
   selecting, by the management plane, multiple of the access nodes to operate as storage nodes of the durable block device, wherein each of the storage nodes have access to at least a portion of one of the storage devices.

8. The method of claim 7, wherein creating the durable block device further comprises:
   receiving, by the management plane, a specification indicating an erasure coding scheme for the durable block device;
   creating, by the management plane, raw volumes on each of the storage nodes, wherein each of the raw volumes includes at least one extent partitioned from the storage devices;
   creating, by the management plane, raw volume sets on each of the controller nodes, wherein each of the raw volume sets includes multiple raw volumes, and wherein the number of raw volumes per raw volume set depends on the erasure coding scheme;
   creating, by the management plane, a durable volume on each of the controller nodes, wherein the durable volume includes the raw volume sets, wherein the durable volume is configured to perform the erasure coding scheme on the data chunk;
   creating, by the management plane, a log structured logical volume on each of the controller nodes, wherein the log structured logical volume is configured to map the data block into the data chunk prior to performance of the erasure coding scheme; and
   creating, by the management plane, a user volume on the attachment node, wherein the user volume is configured to perform compression on the data block prior to inclusion in the data chunk.

9. The method of claim 8, further comprising creating, by the management plane, a volume layer above the log structured logical volume on each of the controller nodes, wherein the volume layer is configured to perform deduplication on the data block prior to inclusion in the data chunk.

10. The method of claim 1, further comprising creating a snapshot volume including point-in-time copies of the durable block device.

11. A system comprising:
   a plurality of storage devices;
   a plurality of servers, wherein a first one of the servers is configured to execute an application, a second one of the servers is configured to execute a management plane for a durable block device, and a third one of the servers is configured to execute a control plane for the durable block device; and
   one or more access nodes interconnected to each other with full-mesh connectivity and in communication with the plurality of storage devices and the plurality of servers, wherein the management plane and control plane manage operation of the one or more access nodes, and wherein the one or more access nodes comprise a data processing unit (DPU) integrated circuit including a host interface configured to communicate data with one or more storage devices of the plurality of storage devices, and a plurality of programmable processing cores configured to:
      execute data plane software for the durable block device providing persistent, redundant, block-level storage of data blocks within multiple volumes virtualized from the one or more storage devices, wherein, to provide durability for the durable block device, one or more hardware-based accelerator units implemented in the DPU integrated circuit are configured to perform inline erasure coding as a data redundancy technique for storage of the data blocks over the multiple volumes of the storage devices;

receive, from the application, a write request for a data block to the durable block device;

update a data chunk to include the data block, wherein the data chunk includes a sequence of data blocks and a chunk header that maps logical block addresses of the data blocks to physical locations in the data chunk;

based on the data chunk reaching a maximum size or a timer expiring, invoke the one or more hardware-based accelerator units to perform erasure coding of the data blocks included in the data chunk; and store erasure coded pieces of the data blocks over the multiple volumes of the storage devices.

12. The system of claim 11, wherein each of the one or more access nodes includes one or more processing cores and the one or more hardware-based accelerator units, wherein the processing cores are configured to host at least a portion of a data plane for the durable block device, and wherein the hardware-based accelerator units are configured to perform the inline erasure coding of the data blocks prior to storage of the erasure coded pieces over the multiple volumes of the storage devices.

13. The system of claim 12, wherein the hardware-based accelerator units are further configured to perform at least one of compression or deduplication of the data blocks prior to performing the inline erasure coding of the data blocks.

14. The system of claim 11, wherein the plurality of storage devices forms a common pool of storage devices created by the one or more access nodes and accessible by each of the plurality of servers.

15. A data processing unit (DPU) integrated circuit comprising:

a host interface configured to communicate data with one or more storage devices;

a plurality of programmable processing cores; and one or more hardware-based accelerator units implemented in circuitry, wherein one or more of the processing cores are configured to execute data plane software for a durable block device providing persistent, redundant, block-level storage of data blocks within multiple volumes virtualized from the one or more storage devices, wherein, to provide durability for the durable block device, the one or more hardware-based accelerator units are configured to perform inline erasure coding as a data redundancy technique for storage of the data blocks over the multiple volumes of the storage devices, and wherein, when executing the data plane software, the one or more processing cores are configured to:

receive, from an application, a write request for a data block to the durable block device;

update a data chunk to include the data block, wherein the data chunk includes a sequence of data blocks and a chunk header that maps logical block addresses of the data blocks to physical locations in the data chunk;

based on the data chunk reaching a maximum size or a timer expiring, invoke the one or more hardware-based accelerator units to perform erasure coding of the data blocks included in the data chunk; and store erasure coded pieces of the data blocks over the multiple volumes of the storage devices.

16. The DPU integrated circuit of claim 15, wherein the processing cores are configured to host at least a portion of a data plane for the durable block device, and wherein the hardware-based accelerator units are configured to perform the inline erasure coding of the data blocks prior to storage of the erasure coded pieces over the multiple volumes of the storage devices.

17. The DPU integrated circuit of claim 16, wherein the hardware-based accelerator units are further configured to perform at least one of compression or deduplication of the data blocks prior to performing the inline erasure coding of the data blocks.

18. The DPU integrated circuit of claim 15, further comprising:

another host interface configured to communicate data with an application processor; and a network interface to communicate data with a network.

19. The DPU integrated circuit of claim 15, wherein the hardware-based accelerator units perform at least one of compression or deduplication of the data block prior to inclusion in the data chunk.

20. The DPU integrated circuit of claim 15, wherein the data plane software updates the data chunk to include the data block by:

determining, based on a block map table and a logical block address of the data block, whether the data block has a current location in the data chunk;

adding the data block to the current location in the data chunk or allocating a new location in the data chunk for the data block if no current location is found for the data block;

recording the update to the data chunk in a journal;

sending an acknowledgment of the write operation for the data block back to the application;

updating the block map table with the current location of the data block in the data chunk; and updating a chunk table that tracks a count of free blocks in the data chunk.

21. The DPU integrated circuit of claim 20, wherein the data chunk is an active data chunk, and wherein, based on the active data chunk reaching the maximum size or the timer expiring, the active data chunk becomes a transit chunk and is flushed to storage, the journal records are marked as complete, and a next data chunk becomes the active data chunk.

22. The DPU integrated circuit of claim 15, wherein the data plane software is further configured to:

receive, from the application, a read request for another data block from the durable block device;

determine, based on a block map table and a logical block address of the another data block, whether the another data block is present in the data chunk;

if the another data block is present in the data chunk, read the another data block from the data chunk; and if the another data block is not present in the data chunk, send a read request to the volumes of the storage devices, wherein the read request includes a logical volume address of the another data block determined from the block map table.

* * * * *